(12) United States Patent
Maeda et al.

(10) Patent No.: US 10,757,818 B2
(45) Date of Patent: Aug. 25, 2020

(54) WIRING BOARD MANUFACTURING METHOD AND WIRING BOARD

(71) Applicant: NICHIA CORPORATION, Anan-shi (JP)

(72) Inventors: Rie Maeda, Katsuura-gun (JP); Masaaki Katsumata, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 16/553,086

(22) Filed: Aug. 27, 2019

(65) Prior Publication Data

US 2020/0077526 A1 Mar. 5, 2020

(30) Foreign Application Priority Data

Aug. 30, 2018 (JP) ................................. 2018-161244

(51) Int. Cl.
| | | |
|---|---|---|
| *H05K 1/02* | (2006.01) | |
| *H05K 3/00* | (2006.01) | |
| *H05K 3/38* | (2006.01) | |
| *H05K 3/12* | (2006.01) | |

(Continued)

(52) U.S. Cl.
CPC ........... *H05K 3/381* (2013.01); *H05K 1/0296* (2013.01); *H05K 1/0298* (2013.01); *H05K 1/115* (2013.01); *H05K 3/0029* (2013.01); *H05K 3/0032* (2013.01); *H05K 3/1258* (2013.01); *H05K 3/1283* (2013.01); *H05K 3/4061* (2013.01); *H05K 3/4069* (2013.01);

(Continued)

(58) Field of Classification Search
CPC .. H05K 3/0032; H05K 3/0035; H05K 3/0038; H05K 1/0298; H05K 1/0296; H05K 3/0026; H05K 3/0029
See application file for complete search history.

(56) References Cited

U.S. PATENT DOCUMENTS

| | | | | |
|---|---|---|---|---|
| 6,004,619 A | * | 12/1999 | Dippon ................. | H05K 3/107 29/852 |
| 2008/0001297 A1 | * | 1/2008 | Lotz ..................... | H01L 21/4846 257/774 |
| 2010/0096652 A1 | | 4/2010 | Choi et al. | |

(Continued)

FOREIGN PATENT DOCUMENTS

| | | |
|---|---|---|
| EP | 2720315 | 4/2014 |
| JP | 2005-093945 | 4/2005 |

(Continued)

OTHER PUBLICATIONS

Machine Translation of WO 2012/132325 A1 Apr. 2012 (Year: 2012).*

*Primary Examiner* — Jeremy C Norris

(74) *Attorney, Agent, or Firm* — Mori & Ward, LLP

(57) ABSTRACT

A wiring board manufacturing method includes: forming a first groove structure in a first principal surface of a base by scanning with laser light in a first irradiation pattern such that the first groove structure has a first width; irradiating an inside of the first groove structure with laser light in a second irradiation pattern that is different from the first irradiation pattern to form recessed portions inside the first groove structure; and forming a first wiring pattern by filling the first groove structure with a first electrically-conductive material to form a first wiring pattern whose shape matches with a shape of the first groove structure in a top view.

19 Claims, 26 Drawing Sheets

(51) Int. Cl.
*H05K 3/40* (2006.01)
*H05K 1/11* (2006.01)
(52) U.S. Cl.
CPC ............ *H05K 2203/0353* (2013.01); *H05K 2203/107* (2013.01); *H05K 2203/1476* (2013.01)

(56) References Cited

U.S. PATENT DOCUMENTS

| | | |
|---|---|---|
| 2012/0007101 A1 | 1/2012 | Yang et al. |
| 2012/0110839 A1 | 5/2012 | Nishio et al. |
| 2012/0138336 A1 | 6/2012 | Watanabe et al. |
| 2015/0008019 A1 | 1/2015 | Miura et al. |
| 2015/0008589 A1 | 1/2015 | Suzuki et al. |
| 2015/0034366 A1* | 2/2015 | Yoshioka ............ H05K 1/111 174/251 |
| 2016/0276540 A1 | 9/2016 | Miyabe et al. |

FOREIGN PATENT DOCUMENTS

| | | | |
|---|---|---|---|
| JP | 2006-060150 | 3/2006 | |
| JP | 2010-103469 | 5/2010 | |
| JP | 2012-019217 | 1/2012 | |
| JP | 2012-099768 | 5/2012 | |
| JP | 2013-030759 | 2/2013 | |
| JP | 2014-082336 | 5/2014 | |
| JP | 2014-130981 | 7/2014 | |
| JP | 2014-131072 | 7/2014 | |
| JP | 2015-015378 | 1/2015 | |
| JP | 2015-029031 | 2/2015 | |
| JP | 2015-050369 | 3/2015 | |
| JP | 2016-174018 | 9/2016 | |
| WO | WO-2012132325 A1 * | 10/2012 | ............ H05K 3/045 |

* cited by examiner

WIRING BOARD MANUFACTURING METHOD AND WIRING BOARD

CROSS REFERENCE TO RELATED APPLICATION

This application claims priority to Japanese Patent Application No. 2018-161244, filed on Aug. 30, 2018, the disclosure of which is hereby incorporated by reference in its entirety.

BACKGROUND OF THE INVENTION

Field of the Invention

The present disclosure relates to a wiring board manufacturing method and a wiring board.

Discussion of the Background

Printed wiring boards have been widely used as supports for electronic components for achieving desired electric circuits. The printed wiring boards include insulative substrates and wiring patterns (also referred to as "wire trace") on the insulative substrate. This wiring pattern is usually formed by patterning, specifically by etching an electrically-conductive film deposited on the insulative substrate.

Japanese Patent Publication No. 2015-029031 describes a technique of forming recessed portions by UV laser irradiation in a surface of a glass substrate which serves as a supporting substrate, and thereafter applying an electrically-conductive ink into the recessed portions and curing the ink, thereby forming wires inside the recessed portions. Japanese Patent Publication No. 2006-060150 describes a technique of forming grooves and through holes in an insulator sheet by laser, and placing an electrically-conductive paste inside these structures, thereby forming a wiring board provided with vias penetrating through the supporting substrate.

SUMMARY OF THE INVENTION

A wiring board manufacturing method is set forth herein that includes forming a first groove structure in a first principal surface of a base by scanning with laser light in a first irradiation pattern such that the first groove structure has a first width, irradiating an inside of the first groove structure with laser light in a second irradiation pattern that is different from the first irradiation pattern to form recessed-portions inside the first groove structure, and forming a first wiring pattern by filling the first groove structure with a first electrically-conductive material to form a first wiring pattern whose shape matches with a shape of the first groove structure in a top view.

Embodiments set forth herein can provide wiring boards that can be manufactured through simple processes and that have improved reliability. For example, separation of a wiring pattern from a support is alleviated, whereby the reliability of the wiring board is improved.

BRIEF DESCRIPTION OF THE DRAWINGS

FIG. 9 is a schematic plan view of a resultant structure after the inside of the first groove structure 110 is irradiated with a laser light beam LB in an irradiation pattern which is different from that adopted in formation of the first groove structure 110.

FIG. 21 is a schematic plan view of a resultant structure after the inside of the second groove structure 120 is irradiated with a laser light beam LB in an irradiation pattern which is different from that adopted in formation of the second groove structure 120.

DETAILED DESCRIPTION

Figure 1:
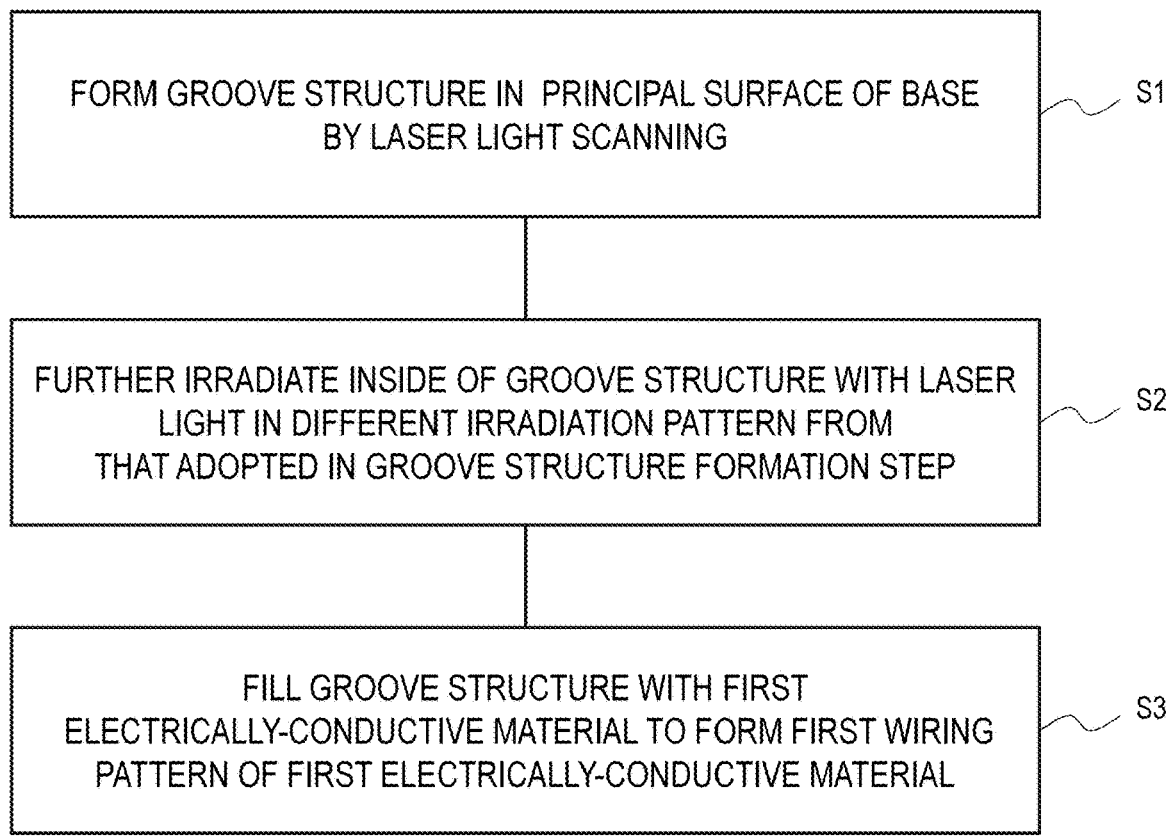
FIG. 1 is a flowchart explaining an exemplary manufacturing method of a wiring board according to an embodiment of the present disclosure.

Hereinafter, embodiments of the present disclosure will be described in detail with reference to the drawings. The embodiments which will be described below are merely exemplary. A wiring board and a wiring board manufacturing method of the present disclosure are not limited to the embodiments which will be described below. For example, values, shapes, materials, steps and the order of steps which will be specified in the embodiments described below are merely exemplary, and various modifications thereto are possible so long as no technical inconsistency occurs.

The dimensions and sizes of components shown in the drawings are sometimes exaggerated for clear understanding. The dimensions, shapes, and relative sizes of components in an actual wiring board and manufacturing apparatus are sometimes not reflected in the drawings. To avoid excessively complicated drawings, some components are sometimes not shown in the drawings.

In the following description, components which have substantially the same function are designated by a common reference numeral, and the description thereof is sometimes omitted. In the following description, the terms which designate specific directions or positions (e.g., "upper", "lower", "right", "left", and other terms including such terms) are sometimes used. Such terms are used merely for clear understanding of relative directions or positions in the referred drawings. So long as the relationship of relative directions or positions designated by terms such as "upper", "lower", etc., in the referred drawings is identical, drawings other than those provided in the present disclosure or actual products and manufacturing devices may not have identical arrangements to those shown in the referred drawings. In the present disclosure, "parallel" includes the cases where two lines, sides or planes are in the range of about ±5° from 0° unless otherwise specified. In the present disclosure, "perpendicular" or "orthogonal" includes the cases where two lines, sides or planes are in the range of about ±5° from 90° unless otherwise specified.

Embodiment 1: Wiring Board Manufacturing Method

FIG. 1 illustrates an exemplary manufacturing method of a wiring board according to an embodiment of the present disclosure. The wiring board manufacturing method illustrated in FIG. 1 generally includes: forming a groove structure in a principal surface of a base by scanning with laser light in a first irradiation pattern (step S1); irradiating an inside of the groove structure with laser light in a second irradiation pattern that is different from the first irradiation pattern adopted in the step of forming the groove structure (step S2); and forming a first wiring pattern by filling the groove structure with a first electrically-conductive material for forming a first wiring pattern (step S3). In the following sections, details of the respective steps will be described.
First Groove Structure Formation Step (A)

Figure 2:
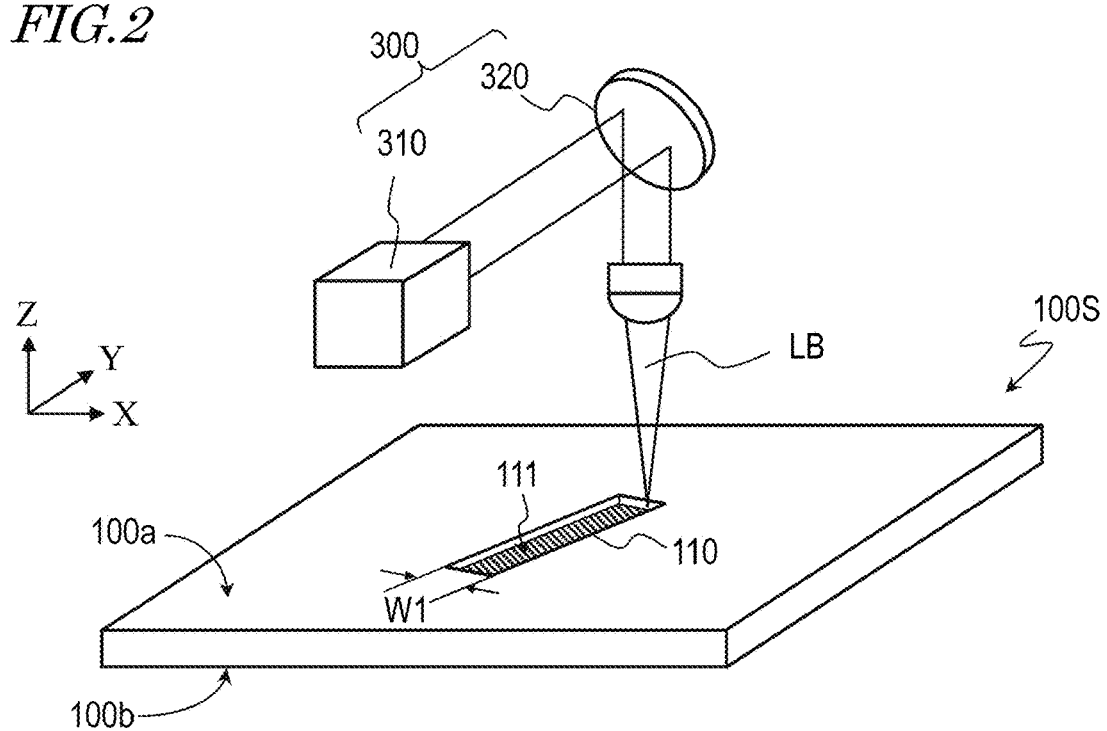
FIG. 2 is a perspective view illustrating a manufacturing method of a wiring board according to an embodiment of the present disclosure.

A base which has principal surfaces is provided. In the present embodiment, a base 100S which has the upper surface 100a as the first principal surface such as shown in FIG. 2 is described as an example. Also, arrows indicating X-direction, Y-direction and Z-direction, which are perpendicular to one another, are shown in FIG. 2. In some of the other drawings of the present disclosure, arrows indicating these directions are shown.

In this example, the external shape of the base 100S as viewed in a direction perpendicular to the upper surface 100a is a rectangular shape. The sides of the rectangular shape extend along the X-direction and the Y-direction shown in the drawings. However, the base 100S is not required to have the rectangular external shape. The base 100S may have a shape appropriately determined. In the example described below, a plate-like member which has the lower surface 100b as the second principal surface opposite to the upper surface 100a is used as the base 100S. The upper surface 100a and the lower surface 100b of the base 100S are typically flat surfaces. However, the upper surface 100a and the lower surface 100b of the base 100S are not required to be flat surfaces. One or both of the upper surface 100a and the lower surface 100b may partially have a curved surface or a step.

As the base 100S, various substrates specified by, for example, ANSI/NEMA Standards can be employed. Particularly suitable examples for the base 100S include: resin substrates such as glass fiber reinforced resin substrates (glass epoxy substrates); flexible substrates which are formed by a resin film of polyimide, polyethylene terephthalate (PET), polyethylene naphthalate (PEN), silicone, or the like; and ceramic substrates of aluminum nitride, aluminum oxide, zirconium oxide. However, the base 100S is not required to be these examples. The base 100S can be purchased, or can be provided by firing a green sheet.

Then, a principal surface of the base is irradiated with laser light, and a groove structure is formed in the principal surface of the base by laser light scanning (step S1 of FIG. 1). The laser light irradiation can be performed by a known laser ablation apparatus. FIG. 2 schematically shows an example employing a laser ablation apparatus 300 which includes a laser light source 310 and a galvanometer mirror 320. The number of galvanometer mirrors in the laser ablation apparatus 300 can be two or more. Examples of the laser light source 310 include $CO_2$ laser, Nd:YAG laser, Nd:YVO$_4$ laser, and the like. Alternatively, a laser light source called green laser which outputs wavelength of 532 nm can also be used as the laser light source 310.

In this step, the upper surface 100a of the base 100S is scanned with a laser light beam LB. By scanning with the laser light beam LB, a part of the base 100S on the upper surface 100a side is removed, whereby a first groove structure 110 having a first width W1 is formed in the upper surface 100a as schematically shown in FIG. 2. At this time, if a material absorbing the laser light is dispersed in the base 100S, the base 100S efficiently absorbs the laser light, and thus partial removal of the surface of the base 100S can be efficiently carried out. A typical example of the material which absorbs the laser light is a colorant. For example, when a UV laser emitting light whose center of the wavelength is in the ultraviolet range is used as the laser light source 310, a filler of titanium dioxide, carbon, barium sulfate, zinc oxide, or the like can be dispersed as the laser light absorbing material in the base 100S. When a green laser is used as the laser light source 310, carbon, nickel oxide, iron oxide (III) or the like can be used for the filler. When an IR laser emitting light whose center of wavelength is in the infrared range is used, carbon, calcium sulfate, magnesium silicate, aluminum oxide, tungsten oxide complex or the like can be used for the filler.

In the present embodiment, by scanning with the beam LB in a certain direction (i.e., first direction), a plurality of first grooves 111 each extending in the first direction are formed on the upper surface 100a side of the base 100S in a first irradiation pattern, whereby the above-described first groove structure 110 is formed. FIG. 2 schematically shows a state in the middle of formation of the first groove structure 110. In the scanning with the beam LB, a galvanometer mirror can be used as in the example of FIG. 2. Alternatively, the base 100S is placed on a stage of quartz glass or the like, and irradiation with the laser light can be carried out while moving the stage in the XY plane. In the example shown in FIG. 2, the first direction is different from either of the X-direction and the Y-direction shown in the drawing. However, the scanning direction of the beam LB can be appropriately determined. The first direction can be identical with the X-direction or the Y-direction.

By forming the plurality of first grooves 111 at an appropriate pitch, the first groove structure 110 which has bottom portions defined by a set of the plurality of first grooves 111 can be formed in the upper surface 100a of the base 100S as schematically shown in FIG. 2. In the example shown in FIG. 2, the first groove structure 110 includes a portion which extends in a direction different from the first direction and which has the first width W1. Herein, the first width W1 is a length of the first groove structure 110 measured in a direction perpendicular to the direction in which the first groove structure extends. As understood from the above-described principles in formation of the first groove structure 110, the first width W1 is greater than a second width that is the width of each of the plurality of first grooves 111.

Figure 3:
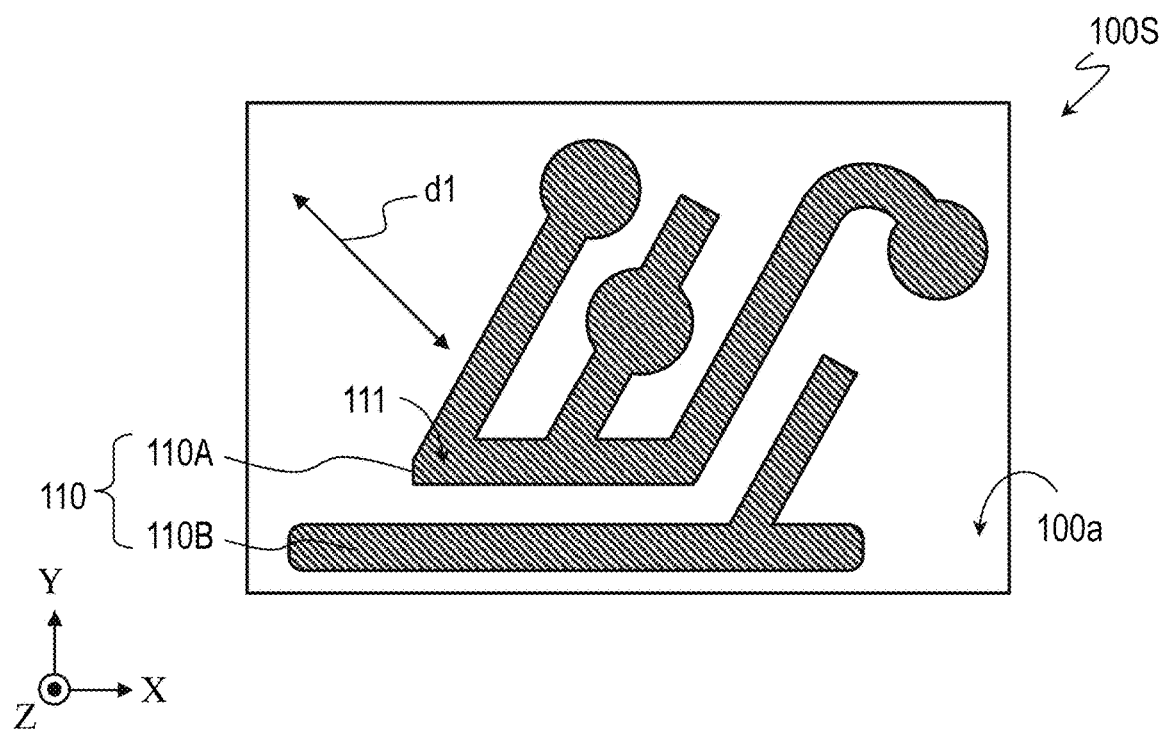
FIG. 3 is a schematic plan view showing an example of a base 100S after formation of a first groove structure 110.

FIG. 3 shows an example of the base 100S after formation of the first groove structure 110. In the example shown in FIG. 3, the first groove structure 110 is formed in the upper surface 100a of the base 100S. The first groove structure 110 illustrated in FIG. 3 includes a first portion 110A which includes three branches, and a second portion 110B which is in a Y-shape. The first groove structure 110 can have any appropriate shape as viewed in the normal direction of the upper surface 100a of the base 100S. The first groove structure 110 can include branches and bends, for example, typically in the first portion 110A shown in FIG. 3, or can include regions having different widths along the extending direction of the first groove structure 110. When the first groove structure 110 includes a plurality of portions as in the example shown in FIG. 3, the shape and arrangement of the respective portions and the number of portions are also arbitrary. The shape of the first groove structure 110 illustrated in FIG. 3 is merely an example for description purposes. As a matter of course, the shape of the first groove structure 110 is not required to be the shape in the drawings.

As described above, each of the plurality of first grooves 111 that form the bottom portion of the first groove structure 110 extends in the first direction. In FIG. 3, the first direction is designated by double-headed arrow d1. Each of the first grooves 111 is typically formed by pulsed irradiation of laser light in the first direction such that laser irradiation spots partially overlap. Therefore, the extending direction of the first groove structure 110 is not required to be the first direction, in other words, the extending direction of the first grooves 111. The laser irradiation spot during formation of these first grooves 111 can be moved in one-way direction or back-and-forth direction (i.e., reciprocation) between adjacent two of the first grooves 111.

First Irradiation Step (B)

Subsequently, the inside of the first groove structure is further irradiated with laser light in an irradiation pattern different from that adopted in the step of forming the first groove structure (step S2 of FIG. 1). For example, the bottom portion of the first groove structure 110 is irradiated with the laser light beam LB in a pulsed manner, whereby a plurality of recessed portions are formed in the bottom portion of the first groove structure 110.

Figure 4:
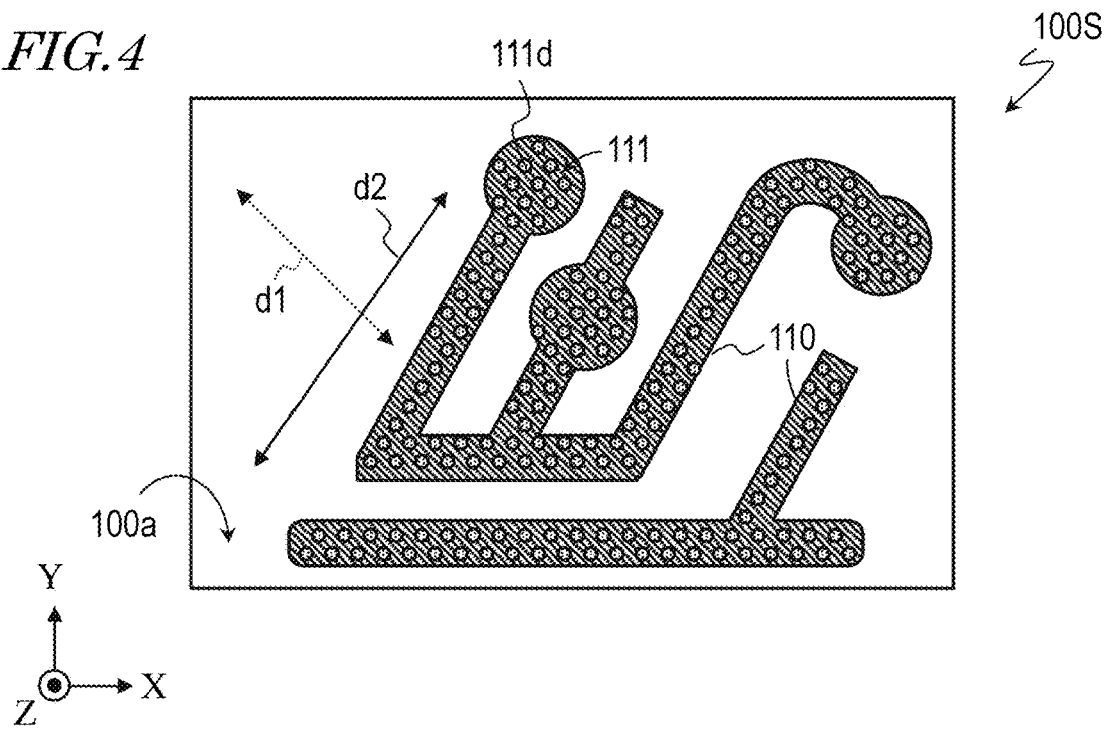
FIG. 4 is a schematic plan view showing a resultant structure after the inside of the first groove structure 110 shown in FIG. 3 is further irradiated with laser light.

FIG. 4 schematically shows a resultant structure after the inside of the first groove structure 110 shown in FIG. 3 is further irradiated with laser light. In this example, by irradiation of the bottom portion of the first groove structure 110 with the laser light, a plurality of recessed portions having dot shapes in a plan view are formed in the bottom portion of the first groove structure 110. Hereinafter, the plurality of recessed portions are referred to as "first recessed portions 111d".

As described in the foregoing, the laser light beam LB is applied in a pulsed manner so as to overlap a set of the plurality of first grooves 111 which form the bottom portion of the first groove structure 110, whereby, for example, the plurality of first recessed portions 111d can be formed inside the first groove structure 110. As schematically shown in FIG. 4, the first recessed portions 111d can have a diameter greater than the width of each first groove 111 (second width). In FIG. 4, the first recessed portions 111d are shown larger with some exaggeration for convenience in description. In some of the other drawings, the first recessed portions 111d and other elements are shown with some exaggeration.

In the present embodiment, the plurality of first recessed portions 111d are in a triangular lattice arrangement. As a matter of course, the arrangement of the plurality of first recessed portions 111d is not restricted thereto. Typically, the first recessed portions 111d are formed in a uniform density across the bottom portion of the first groove structure 110. With respect to the distance between the centers of two of the first recessed portions 111d, the plurality of first grooves 111 can have a pitch in the range of, for example, 10% to 100%.

The second irradiation pattern in the step of further irradiating the bottom portion of the first groove structure 110 with laser light is different from that adopted in formation of the first groove structure 110. For example, the bottom portion of the first groove structure 110 is intermittently irradiated with laser light along a second direction (designated by double-headed arrow d2 in FIG. 4) that intersects the above-described first direction, whereby the plurality of first recessed portions 111d aligned in the second direction can be formed in the bottom portion of the first groove structure 110. By repeating this scanning procedure, the plurality of first recessed portions 111d can be formed, for example, in a triangular lattice arrangement in the bottom portion of the first groove structure 110. The second direction can be, for example, a direction perpendicular to the first direction. However, it is not required that the second direction is perpendicular to the first direction.

The direction of the laser light scanning in this step is not required to be a direction different from the above-described first direction. Specifically, the direction of the laser light scanning to form the plurality of first recessed portions 111d can be identical with the first direction. In this specification, "different irradiation pattern" is not required to be such an operation that the trace of movement of the laser irradiation spot is different, but broadly interpreted so as to include such an operation that, between the first laser light irradiation step and the second laser light irradiation step, the trace of movement of the laser irradiation spot (or the trace of movement of the laser head relative to the stage) is identical but the laser power, the pulse interval and the like are different.

Figure 5:
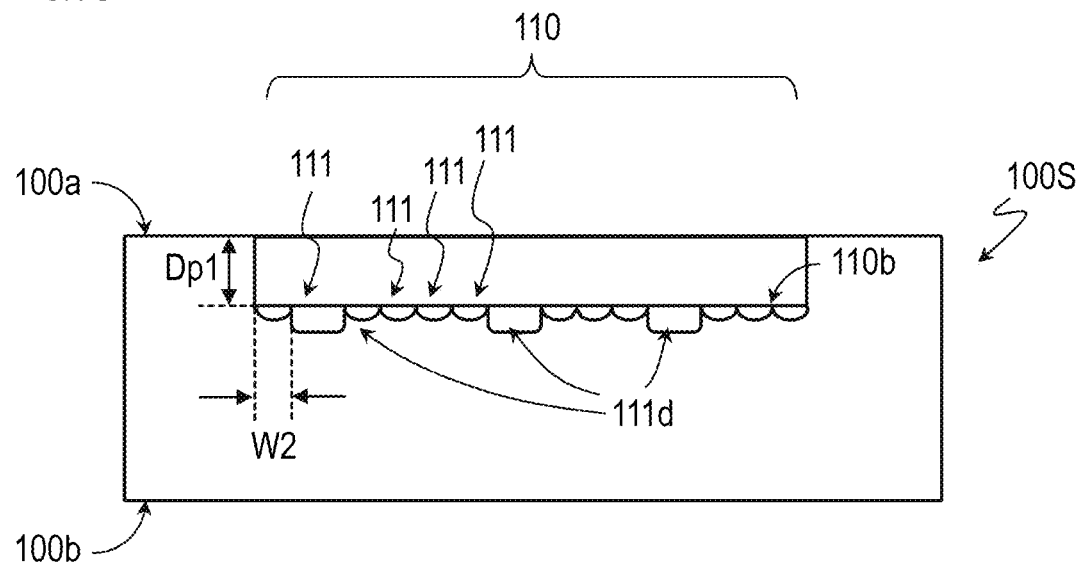
FIG. 5 is a schematic cross-sectional view enlarging a cross section of a part of the base 100S shown in FIG. 4.

FIG. 5 shows an enlarged cross section of a part of the base 100S shown in FIG. 4. The cross section shown in FIG. 4 corresponds to a cross section of the base 100S taken along a plane perpendicular to the first direction in which the plurality of first grooves 111 extend on the bottom portion. As schematically shown in FIG. 5, the first groove structure 110 has a first bottom surface 110b which is formed by a set of the plurality of first grooves 111. Each of the plurality of first grooves 111 has the second width W2. In the present embodiment, the second width W2 is smaller than the first width W1 of the first groove structure 110.

The position of the first bottom surface 110b of the first groove structure 110 is substantially coincident with the position of a plurality of apexes formed between two adjacent first grooves 111. The distance between the first bottom surface 110b of the first groove structure 110 and the upper surface 100a of the base 110S, in other words, the depth Dp1 of the first groove structure 110, can be in the range of, for example, about 5 μm to about 50 μm.

For example, by applying the laser light so as to overlap one or more first grooves 111, a part of the first bottom surface 110b can further be removed, and of the further irradiated first recessed portions 111d can be formed as deeper portions in the first bottom surface 110b. The laser power in the step of forming the plurality of first recessed portions 111*d* can be identical with, or can be higher than, the laser power in the step of forming the first groove structure 110.

The plurality of first recessed portions 111*d* can include recessed portions with different depths. For example, the recessed portions with dot shape which have different depths are alternately formed in a two-dimensional arrangement. This can exert a stronger anchoring effect on an electrically-conductive material which will be described later.

First Wiring Pattern Formation Step (C)

Figure 6:
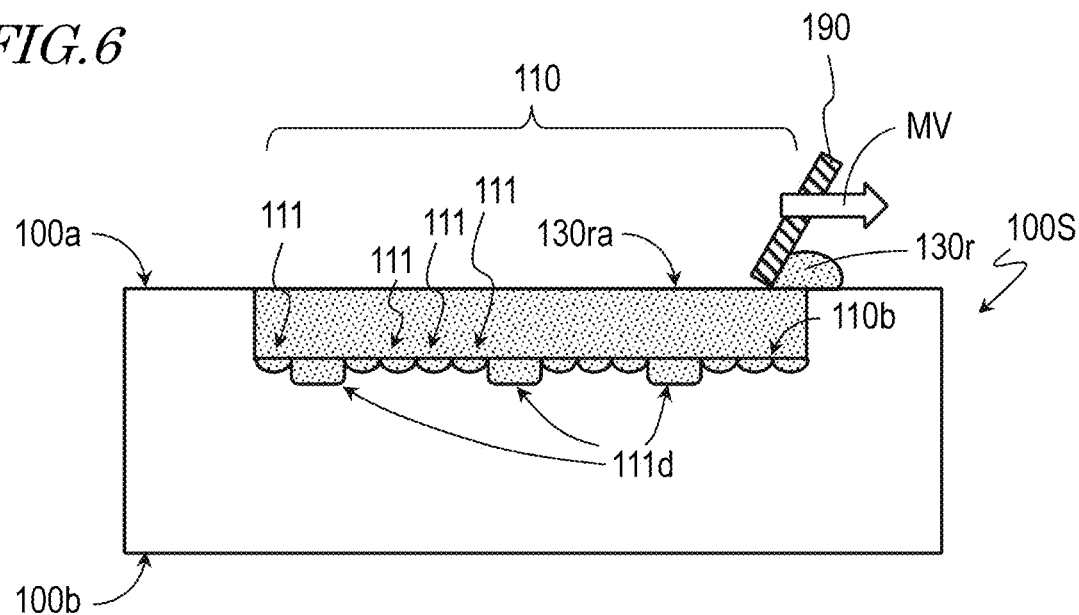
FIG. 6 is a schematic cross-sectional view illustrating a manufacturing method of a wiring board of an embodiment of the present disclosure.

Subsequently, the first groove structure is filled with a first electrically-conductive material, whereby the first wiring pattern is formed of the first electrically-conductive material (step S3 of FIG. 1). In the present embodiment, as schematically shown in FIG. 6, the first groove structure 110 is filled with an electrically-conductive paste 130*r* as the first electrically-conductive material. FIG. 6 shows an example where the electrically-conductive paste 130*r* is placed inside the first groove structure 110 by printing with the use of the squeegee 190.

The electrically-conductive paste 130*r* can be a material in which particles of Au, Ag, Cu or the like are dispersed in a base material such as an epoxy resin. For example, a known Au paste, Ag paste, or Cu paste can be used as the electrically-conductive paste 130*r*. The electrically-conductive paste 130*r* can contain a solvent. Instead of the electrically-conductive paste 130*r*, for example, an alloy material in which copper powder is contained in a Sn—Bi based solder can be use as the first electrically-conductive material.

First, the electrically-conductive paste 130*r* is applied to the inside of the first groove structure 110 or onto the upper surface 100*a* of the base 110S, and the squeegee 190 is moved across the upper surface 100*a* as illustrate by thick arrow MV in FIG. 6. In this step, part of the electrically-conductive paste 130*r* enters the inside of the first grooves 111 and the inside of the first recessed portions 111*d*. That is, the inside of the first grooves 111 and the inside of the first recessed portions 111*d* are filled with the electrically-conductive paste 130*r*.

A bulging part of the electrically-conductive paste 130*r* applied onto the base 100S which is positioned higher level than the upper surface 100*a* of the base 100S is removed by moving the squeegee 190. By removing the unnecessary part of the electrically-conductive paste 130*r*, the surface 130*r* a of the electrically-conductive paste 130*r* can be made substantially coplanar with the upper surface 100*a* of the base 100S.

The method of applying the electrically-conductive paste 130*r* to the base 100S is not required to be the method using a squeegee. Application of the electrically-conductive paste 130*r* can be realized by various printing methods, including spin coating, dip coating, screen printing, offset printing, flexo printing, gravure printing, microcontact printing, inkjet printing, nozzle printing, and aerosol jet printing. As a matter of course, the electrically-conductive paste 130*r* can be applied to the base 100S by a method other than printing.

Figure 7:
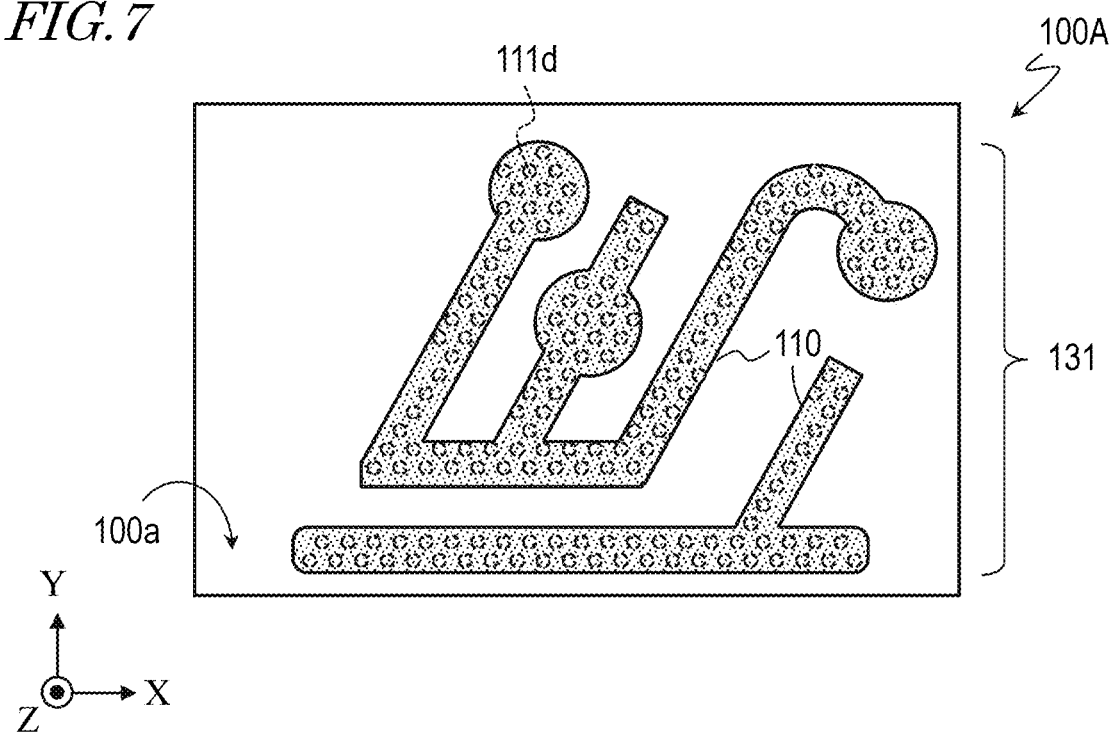
FIG. 7 is schematic plan view for illustrating a manufacturing method of a wiring board according to an embodiment of the present disclosure.

Thereafter, the electrically-conductive paste 130*r* placed inside the first groove structure 110 is cured by heating or light irradiation. By curing the electrically-conductive paste 130*r*, a first wiring pattern 131 can be formed of the electrically-conductive paste 130*r* such that the first wiring pattern 131 has a shape that matches with the shape of the first groove structure 110 as viewed in the normal direction of the upper surface 100*a* of the base 100S as schematically shown in FIG. 7. Through the above-described process, a wiring board 100A is obtained which includes the first wiring pattern 131 on the upper surface 100*a* side.

If the surface of the electrically-conductive paste 130*r* protrudes from or higher level than the upper surface 100*a* of the base 100S after the electrically-conductive paste 130*r* has been cured, a grinding step can be additionally carried out as necessary after the electrically-conductive paste 130*r* has been cured. In the example shown in FIG. 8, the surface of the cured electrically-conductive paste 130*r* and the upper surface 100*a* of the base 100S are ground using a grindstone 200 attached to a grinder or the like. By grinding, the ground surfaces which are the upper surface 131*a* of the first wiring pattern 131 and the upper surface 100*a* of the base 100S can be made coplanar to each other. Also, the residue of the electrically-conductive paste 130*r* adhered to the upper surface 100*a* of the base 100S can be removed. When necessary, a copper plating layer or a nickel-gold plating layer can be formed on the cured electrically-conductive paste 130*r*.

According to the present embodiment, a wiring board which includes a wiring pattern having an appropriately determined shape can be manufactured through a relatively simple process. As clearly seen from the foregoing, the shape of the first wiring pattern 131 depends on the shape of the first groove structure 110. The first groove structure 110 is formed by laser light irradiation, thus the shape of the first wiring pattern 131 can be determined with highly flexible design configurations. The laser irradiation can form a relatively deep first groove structure in a range of about 5 μm to about 50. Accordingly, the thickness of the wiring pattern can easily be controlled, particularly wires having high aspect ratios can be formed, as compared with patterning formed by etching. Increase of the aspect ratio is advantageous in reducing the wiring resistance. According to the method of the present embodiment, a wiring with fine line width can also be formed relatively easily with high accuracy. Further, the first wiring pattern 131 can be formed by curing the electrically-conductive paste used as the first electrically-conductive material, thus the etching step can be omitted. Therefore, the cost of disposal of waste solutions does not occur.

Further, in the above-described example, the inside of the first groove structure 110 is irradiated with laser light in an irradiation pattern which is different from that adopted in the step of forming the first groove structure 110. By the second laser light irradiation, a concave and convex pattern including, for example, the plurality of first recessed portions 111*d* can further be formed in the first bottom surface 110*b* which includes the plurality of first grooves 111. As described above, typically, the first electrically-conductive material is placed inside the plurality of first recessed portions 111*d*, and therefore, the first wiring pattern 131 usually has such a cross-sectional shape in which a part of the first wiring pattern 131 is positioned inside the plurality of first recessed portions 111*d*. Because a part of the first wiring pattern 131 is positioned inside the plurality of first recessed portions 111*d* which is deeper than the first bottom surface 110*b*, the area of the interface between the first wiring pattern 131 and the base 100S increases. Due to the increase of the area of the interface between the first wiring pattern 131 and the base 100S, a stronger anchoring effect is achieved. Due to this effect, separation of the first wiring pattern 131 from the base 100S can be alleviated. That is, a wiring board with improved reliability can be provided. A silane coupling agent can be applied to the inside of the first groove structure 110 before the first electrically-conductive material is placed, thus the effect of alleviating separation of the first wiring pattern 131 can further be improved.

As previously described with reference to FIG. 8, by performing a grinding step as an additional step after the electrically-conductive paste is cured, the upper surface 131a of the first wiring pattern 131 can be made coplanar with the upper surface 100a of the base 100S. This can provide a thinner wiring board whose upper surface 100a of the base 100S has no or less protrusion. In an embodiment of the present disclosure, the surface of the wiring pattern is coplanar with or lower than the surface of the base, whereas in conventional printed wiring boards formed by etching of a conductor film, wires protrude from the surface of a substrate which supports the wires. That is, a thin wiring board which has wires with fine line width and high aspect ratio can advantageously be provided. The upper surface 131a of the first wiring pattern 131 and the upper surface 100a of the base 100S can easily be made coplanar. A wiring board with good mountability can be provided.

Variations

In the above-described example which has been described with reference to FIG. 4 and relevant drawings, the plurality of first recessed portions 111d having dot shapes in a plan view are formed in the first bottom surface 110b by further irradiating the first bottom surface 110b of the first groove structure 110 with laser light. However, the irradiation pattern in the step of further irradiating the first bottom surface 110b with laser light does not necessarily have to be the above-described example. For example, a plurality of second grooves can be formed in the first bottom surface 110b by scanning along the second direction.

Figure 9:
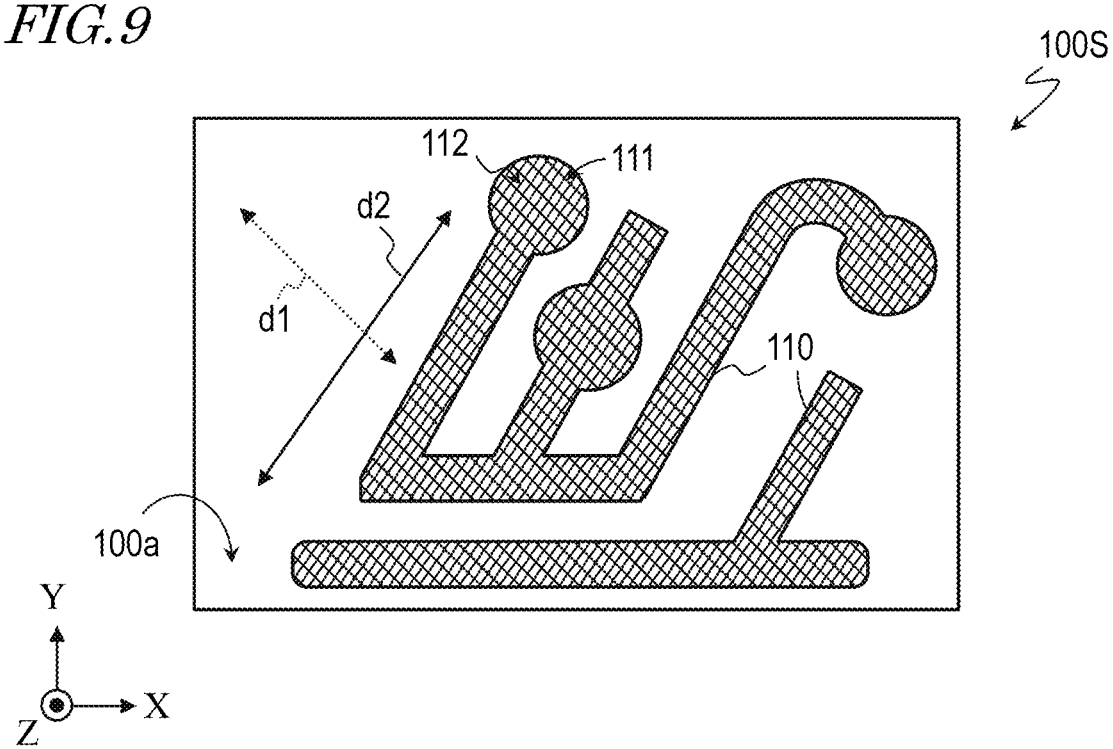
FIG. 9 is a diagram illustrating a variation of a manufacturing method of a wiring board according to an embodiment of the present disclosure, more specifically.

FIG. 9 is a diagram showing a variation of Embodiment 1 that has been described above. Specifically, FIG. 9 schematically shows a resultant structure after the first groove structure 110 is formed, and the inside of the first groove structure 110 is irradiated with a laser light beam LB in an irradiation pattern different from that adopted in formation of the first groove structure 110. In the example shown in FIG. 9, the first bottom surface 110b is scanned with the laser light beam LB in the second direction such that a plurality of second grooves 112 each extending in the second direction, which are the same as or similar to the above-described first grooves 111, are further formed inside the first groove structure 110.

In the present variation, the second direction is different from the first direction. Typically, the second direction is a direction perpendicular to the first direction. However, the second direction is not required to be a direction perpendicular to the first direction. The second direction can be appropriately selected from arbitrary directions other than the first direction. By forming the plurality of second grooves 112 so as to overlap the plurality of first grooves 111 in a plan view, as a result, deeper portions can be formed at the intersections of the first grooves 111 and the second grooves 112. These relatively deep portions can be recessed portions having dot shapes in a plan view, which are the same as or similar to the plurality of first recessed portions 111d.

Figure 10:
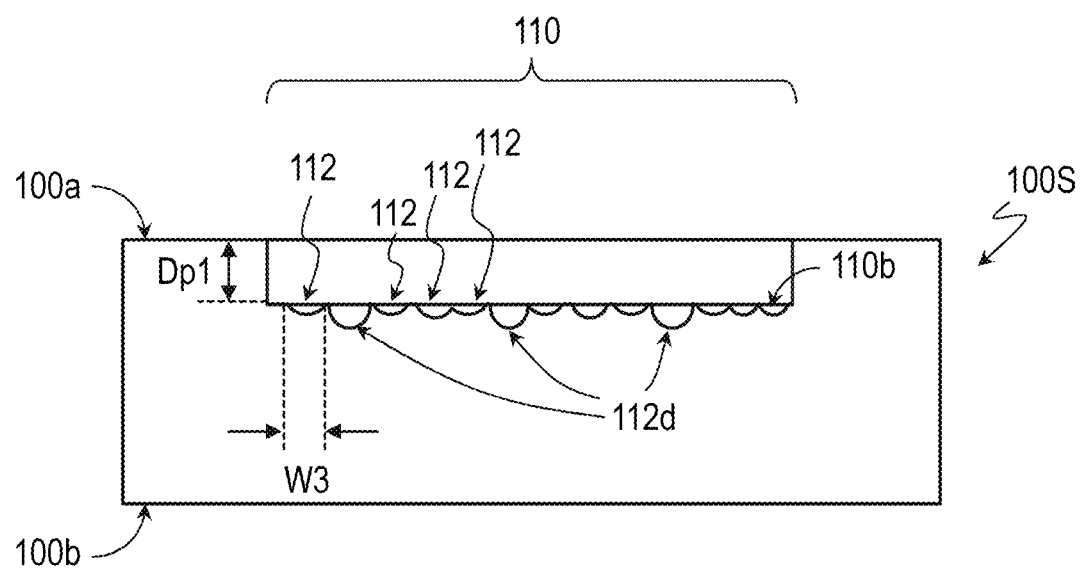
FIG. 10 is a schematic cross-sectional view enlarging a cross section of a part of the base 100S shown in FIG. 9.

FIG. 10 shows an enlarged cross section of a part of the base 100S shown in FIG. 9. Specifically, FIG. 10 schematically shows a cross section of the base 100S taken along a plane perpendicular to the second direction in which the plurality of second grooves 112 extend. This example is equal to the above-described example in that the first groove structure 110 includes the first bottom surface 110b that is formed by a set of the plurality of first grooves 111. In the present variation, however, the plurality of second grooves 112 are further formed in the first bottom surface 110b by partial removal of the base 100S using laser light scanning.

In this example, the plurality of second grooves 112 are formed so as to overlap the plurality of first grooves 111, and therefore, deeper portions are formed at the intersections of the first grooves 111 and the second grooves 112. Hereinafter, these deeper portions are also referred to as "first recessed portions 112d" for the sake of convenience.

Each of the plurality of second grooves 112 has a third width W3. The third width W3 is smaller than the first width W1 of the first groove structure 110. The values set for the laser power, the pulse interval and the like in the step of forming the plurality of second grooves 112 can be equal to, or can be different from, those in the step of forming the plurality of first grooves 111. Also, the arrangement pitch of the second grooves 112 can be equal to, or can be different from, that of the first grooves 111.

As in this example, a plurality of second grooves 112 extending in a direction different from the extending direction of the plurality of first grooves 111 (i.e., first direction) can be formed by further irradiating with laser light, instead of forming a plurality of first recessed portions 111d by irradiating with the laser light beam LB with intervals along the second direction. According to the present embodiment, an appropriately selected pattern can be formed in the bottom portion of the first groove structure 110 relatively easily by irradiation with laser light in a different irradiation pattern. As in this example, the plurality of second grooves 112 each having a smaller width than the first width W1 are formed in the first bottom surface 110b, and the first groove structure 110 which has a concave and convex pattern in the form of a grid in the bottom portion is obtained, so that improvement in the anchoring effect can be expected. That is, separation of the first wiring pattern 131 from the base 100S can be alleviated, thereby improving the reliability of the wiring board.

Particularly, as shown in FIG. 10, a plurality of second grooves 112 which intersect the plurality of first grooves 111 are formed in the first bottom surface 110b so as to overlap the plurality of first grooves 111, whereby first recessed portions 112d which are deeper than these grooves can be formed at the intersections of the first grooves 111 and the second grooves 112. By forming such first recessed portions 112d, the anchoring effect can further be improved as in the case where the plurality of first recessed portions 111d having dot shapes in a plan view are formed. Also, in this example, a silane coupling agent is applied to the inside of the first groove structure 110 before the first electrically-conductive material is placed, so that the effect of alleviating separation of the first wiring pattern 131 can be improved.

Figure 11:
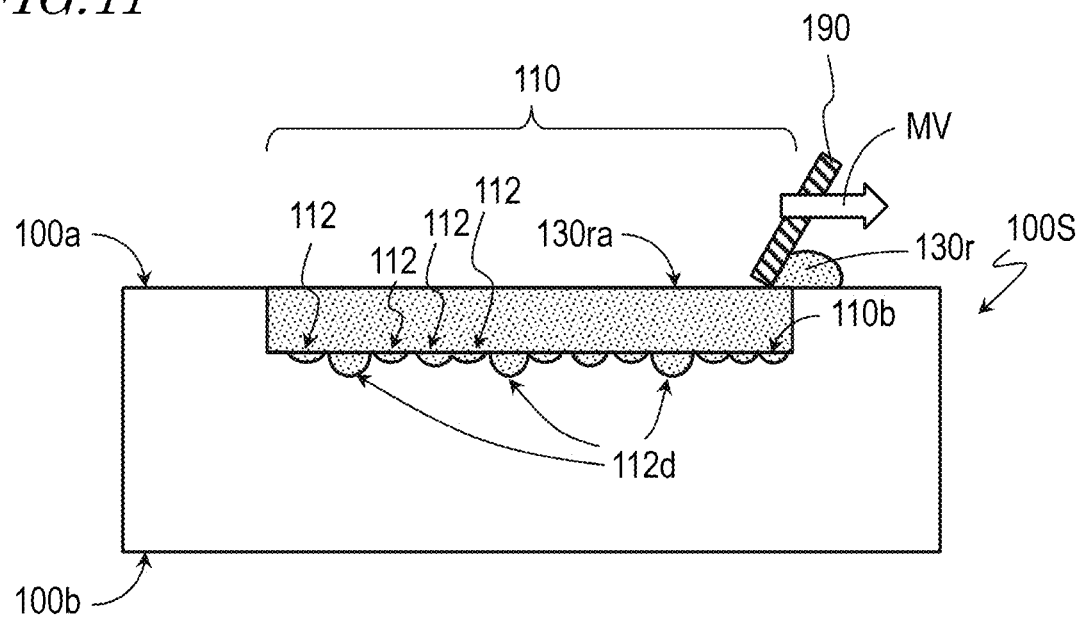
FIG. 11 is a schematic cross-sectional view illustrating a variation of a manufacturing method of a wiring board according to an embodiment of the present disclosure.

The steps subsequent to formation of the plurality of second grooves 112 can be the same as those in the above-described example which has been described with reference to FIG. 6 and FIG. 7. Specifically, after the plurality of second grooves 112 are formed, the inside of the first groove structure 110 is filled with the first electrically-conductive material, for example, the electrically-conductive paste 130r, as schematically shown in FIG. 11. In this step, the inside of the first recessed portions 112d can be filled with an electrically-conductive paste 130r.

Figure 12:
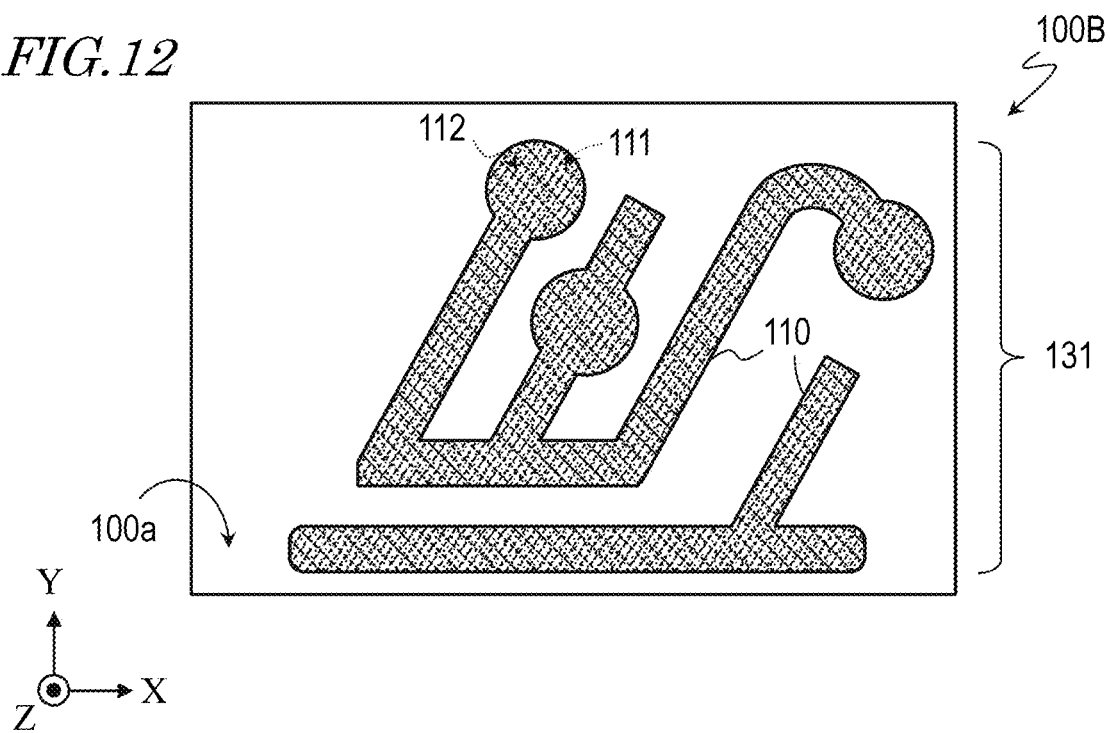
FIG. 12 is a schematic plan view illustrating a variation of a manufacturing method of a wiring board according to an embodiment of the present disclosure.

After the electrically-conductive paste 130r is applied to the base 100S, the electrically-conductive paste 130r is cured, whereby a wiring board 100B including a first wiring pattern 131 whose shape matches with the first groove structure 110 can be obtained (see FIG. 12) likewise as in the example of FIG. 7. In the wiring board 100B, the first bottom surface 110b of the first groove structure 110 includes the plurality of second grooves 112 each extending in a direction different from the extending direction of the plurality of first grooves 111 in addition to the plurality of first grooves 111. Likewise, as in the example which has been described with reference to FIG. 8, when necessary, the surface of the cured electrically-conductive paste 130r and the upper surface 100a of the base 100S can be ground.

Figure 13:
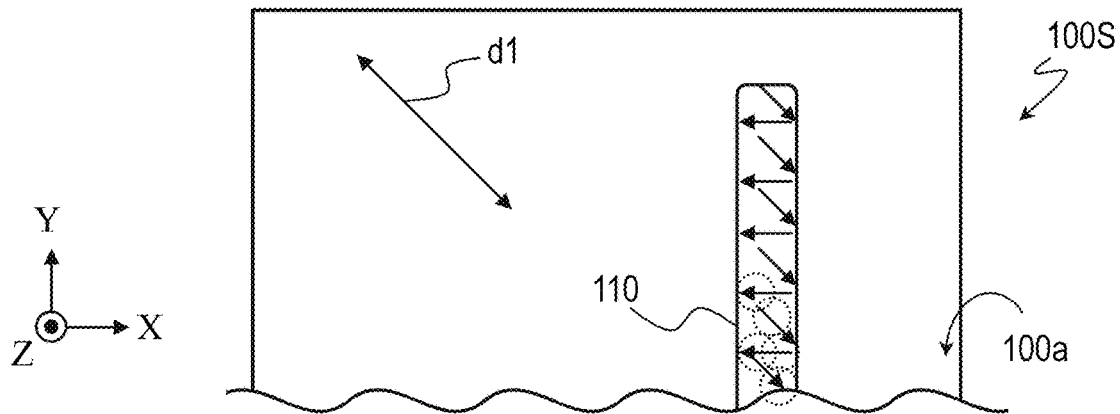
FIG. 13 is a schematic plan view illustrating still another variation of a manufacturing method of a wiring board according to an embodiment of the present disclosure.

In each of the above-described examples, the plurality of first grooves 111 are formed by laser light scanning along the first direction. However, the trace of movement of the laser irradiation spot in formation of the first groove structure 110 is not required to be repetition of a linear movement along a single direction. For example, as schematically shown by broken line circles and solid line arrows in FIG. 13, laser light scanning can be carried out such that the laser irradiation spot moves in a zig-zag manner, whereby the surface of the base 100S is partially removed and the first groove structure 110 is formed. The first grooves 111 are not required to be a plurality of linear grooves which are parallel to one another, but can be in the shape of concentric circles, concentric polygons, a spiral, or the like, as seen from the top.

Embodiment 2: Wiring Board Manufacturing Method

After the first wiring pattern 131 is formed on the upper surface 100a side of the base 100S, another wiring pattern can be further formed on the lower surface 100b side of the base 100S in the same way as that previously described. By further forming another wiring pattern on the lower surface 100b side of the base 100S, for example, a double-sided board can be obtained.

Figure 14:
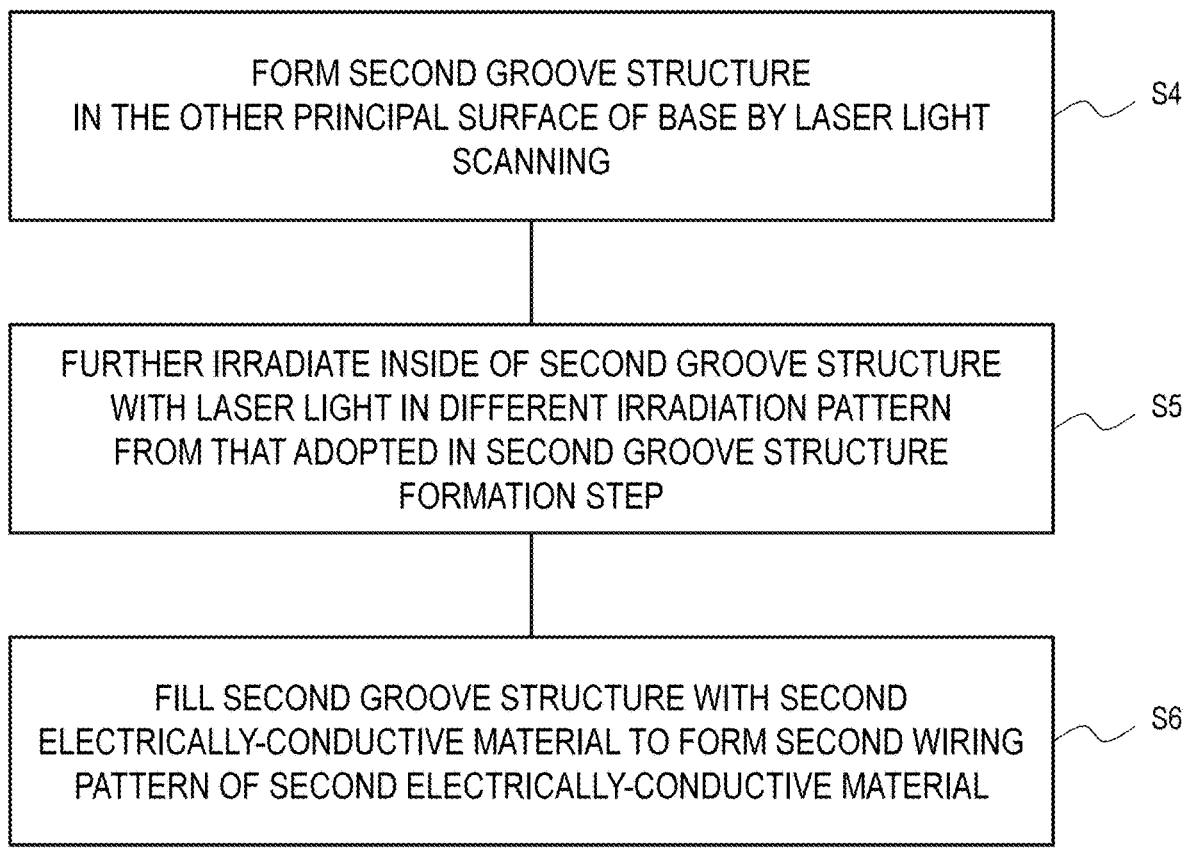
FIG. 14 is a flowchart explaining a part of an exemplary manufacturing method according to a wiring board of another embodiment of the present disclosure.

FIG. 14 explains a part of an exemplary manufacturing method of a wiring board of another embodiment of the present disclosure. The wiring board manufacturing method explained in FIG. 14 includes a step of forming a second groove structure in the other principal surface of the base by laser light scanning in a third irradiation pattern (step S4), a step of further irradiating the inside of the second groove structure with laser light in a fourth irradiation pattern different from that adopted in the step of forming the second groove structure (step S5), and a step of filling the second groove structure with a second electrically-conductive material, thereby forming a second wiring pattern of the second electrically-conductive material (step S6). In the following sections, details of the respective steps will be described.

Second Groove Structure Formation Step (D)

The respective steps illustrated in FIG. 14 can be carried out after step S1 to step S3 which have been described with reference to FIG. 1 have been carried out. For example, a wiring board 100A which is manufactured through the above-described procedure is provided. Instead of the wiring board 100A, the wiring board 100B shown in FIG. 12 can be used.

Figure 15:
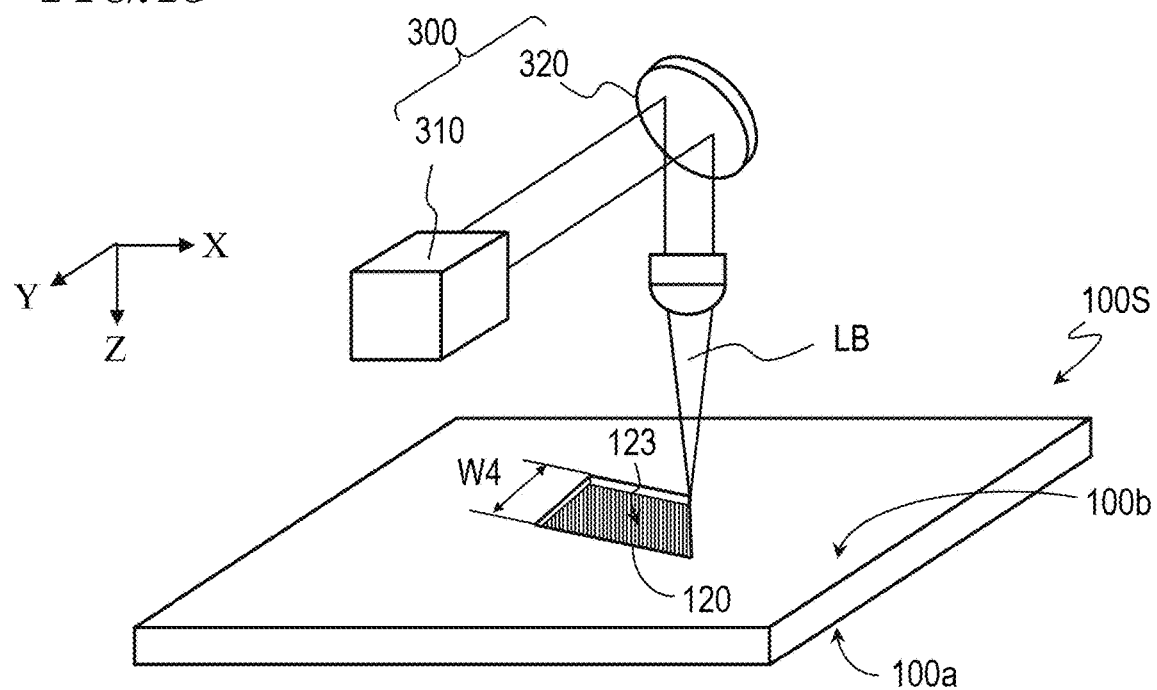
FIG. 15 is a perspective view illustrating a manufacturing method of a wiring board according to another embodiment of the present disclosure.

Then, likewise as in the example described with reference to FIG. 2, the lower surface 100b (second principal surface) which is the other principal surface of the base 100S is irradiated with laser light, and a second groove structure is formed in the lower surface 100b by laser light scanning (step S4 of FIG. 14). For example, likewise as in the example described with reference to FIG. 2, the lower surface 100b of the base 100S is scanned with a laser light beam LB using a laser ablation apparatus 300. By scanning with the laser light beam LB, a part of the base 100S on the lower surface 100b side is removed, whereby a second groove structure 120 having a fourth width W4 is formed in the lower surface 100b as schematically shown in FIG. 15. In the present embodiment, the fourth width W4 of the second groove structure 120 means a length of the second groove structure 120 measured in a direction perpendicular to the direction in which the second groove structure extends.

By scanning the lower surface 100b of the base 100S with the beam LB in a certain direction (e.g., the third direction) in a third irradiation pattern, a plurality of third grooves 123 each extending in the third direction can be formed on the lower surface 100b side of the base 100S as schematically shown in FIG. 15. FIG. 15 schematically shows a state in the middle of formation of the second groove structure 120. The third direction, which is the direction of the scanning with the beam LB in the step of forming the plurality of third grooves 123, can be parallel to the above-described first or second direction or can be different from both the first direction and the second direction.

In the present embodiment, the plurality of third grooves 123 are formed by scanning with the laser light beam LB likewise as in formation of the first groove structure 110 on the upper surface 100a side of the base 100S. By forming the plurality of third grooves 123 each extending in the third direction at an appropriate pitch, the second groove structure 120 which has a bottom portion defined by a set of the plurality of third grooves 123 can be formed.

In the example shown in FIG. 15, the second groove structure 120 extends in a direction different from the third direction, and includes a portion which has the fourth width W4. As readily understood from the principles in formation of the second groove structure 120, a fifth width W5 of each third groove 123 (see FIG. 18 which will be described later) is smaller than the fourth width W4 of the second groove structure 120.

Figure 16:
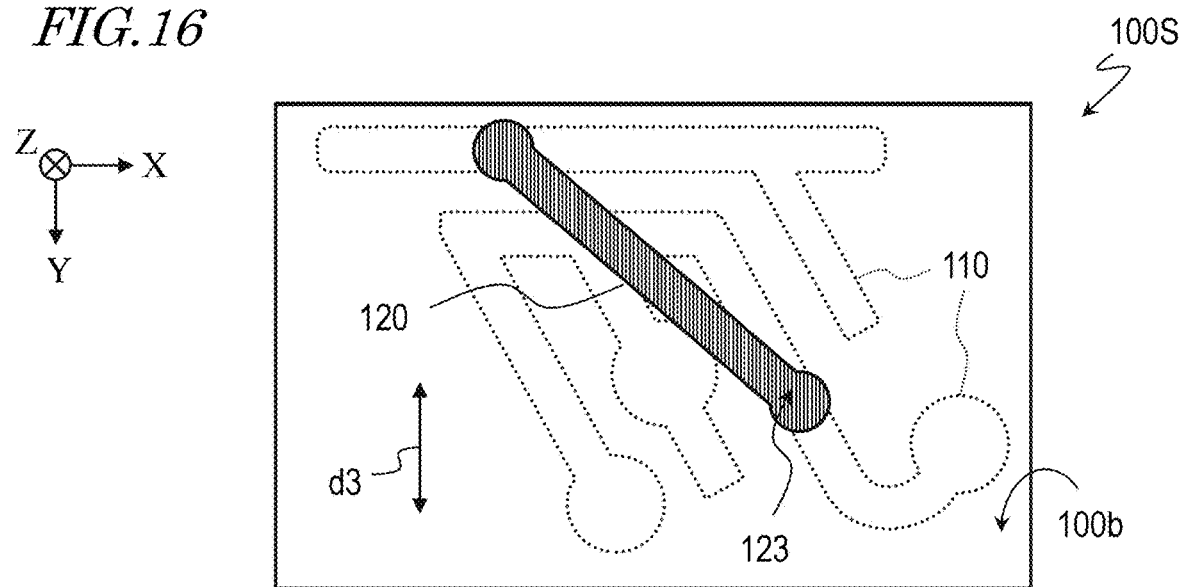
FIG. 16 is a schematic plan view showing an example of the base 100S after formation of a second groove structure 120.

FIG. 16 shows an example of the base 100S after formation of the second groove structure 120. In FIG. 16, the third direction in which the plurality of third grooves 123 extend is schematically designated by double-headed arrow d3. In the configuration illustrated in FIG. 16, the second groove structure 120 has a substantially linear shape extending in a direction different from the above-described third direction. As schematically shown in FIG. 16, in this example, a part of the second groove structure 120 on the lower surface 100b side of the base 100S overlaps the first groove structure 110 located on the upper surface 100a side of the base 100S in a plan view. As a matter of course, the shape of the second groove structure 120 as seen in a plan view can be appropriately determined as is the above-described first groove structure 110. When the second groove structure 120 includes a plurality of portions, the shape and arrangement of the respective portions and the number of portions can be appropriately determined.

In the present embodiment, the second groove structure 120 is formed by forming the plurality of third grooves 123 using laser light. Therefore, the shape of the second groove structure 120 can be determined with highly flexible design configurations. The conditions of the laser light irradiation in the step of forming the second groove structure 120 can be equal to, or can be different from, the conditions of the laser light irradiation in the step of forming the first groove structure 110.

Second Irradiation Step (E)

Subsequently, the inside of the second groove structure is further irradiated with laser light in a fourth irradiation pattern which is different from that adopted in the step of forming the second groove structure (step S5 of FIG. 14). For example, the bottom portion of the second groove structure 120 is irradiated with the laser light beam LB in a pulsed manner, whereby a plurality of recessed portions are formed in the bottom portion of the second groove structure 120 likewise as in formation of the plurality of first recessed portions 111d in the bottom portion of the first groove structure 110.

Figure 17:
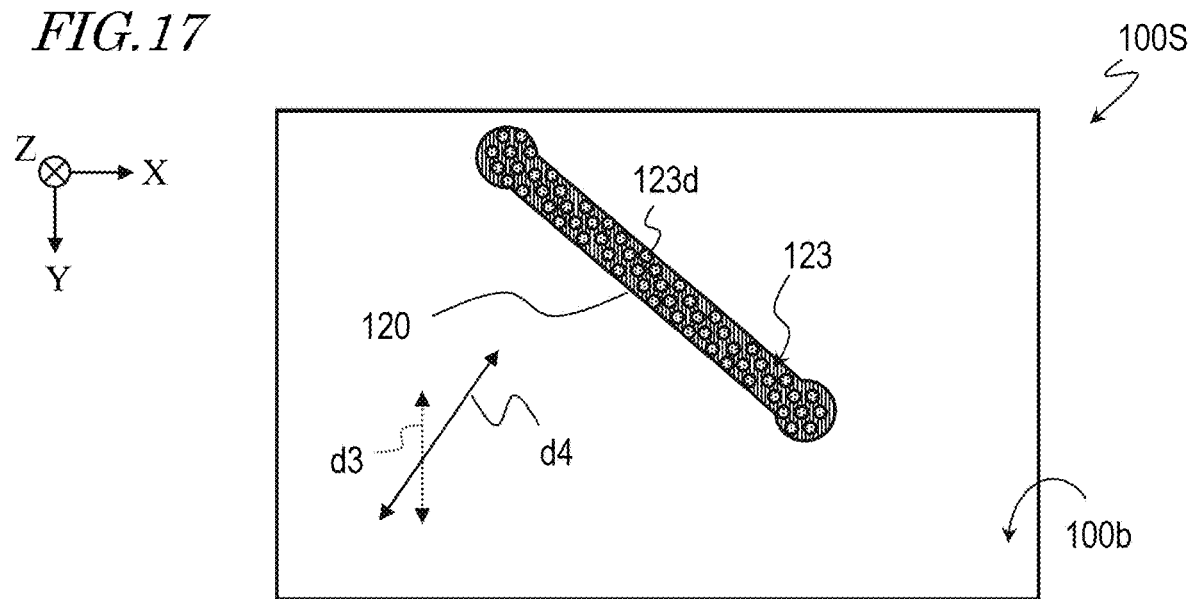
FIG. 17 is a schematic plan view of a resultant structure after the inside of the second groove structure 120 shown in FIG. 16 is further irradiated with laser light.

FIG. 17 schematically shows a resultant structure after the inside of the second groove structure 120 shown in FIG. 16 is further irradiated with laser light. In this example, by irradiation of the bottom portion of the second groove structure 120 with the laser light, a plurality of second recessed portions 123d having dot shapes in a plan view are formed in the bottom portion of the second groove structure 120. As schematically shown in FIG. 17, the diameter of the second recessed portions 123d is, typically, greater than the width (fifth width) of each third groove 123.

The irradiation pattern in the step of further irradiating the bottom portion of the second groove structure 120 with laser light is different from that adopted in formation of the second groove structure 120. In this example, the bottom portion of the second groove structure 120 is intermittently irradiated with laser light along a fourth direction (designated by double-headed arrow d4 in FIG. 17) that intersects the above-described third direction, whereby the plurality of second recessed portions 123d aligned in the fourth direction can be formed in the bottom portion of the second groove structure 120. The fourth direction can be a direction parallel to any of the above-described first, second and third directions. The fourth direction can be a direction different from all of the above-described first, second and third directions.

In the present embodiment, the irradiation conditions, such as laser power, in the step of forming the second recessed portions 123d can be equal to, or can be different from, the irradiation conditions of laser light in formation of the first recessed portions 111d on the upper surface 100a side of the base 100S. Also, in the present embodiment, the plurality of second recessed portions 123d formed in the bottom portion of the second groove structure 120 are in a triangular lattice arrangement as are the first recessed portions 111d on the upper surface 100a side of the base 100S, although the arrangement of the plurality of second recessed portions 123d and the number of second recessed portions 123d are appropriately determined as a matter of course. The pitch of the plurality of third grooves 123 can be in the range of, for example, 10% to 100% with respect to the distance between the centers of two of the second recessed portions 123d. The plurality of second recessed portions 123d can include several types of recessed portions which have different depths.

Second Wiring Pattern Formation Step (F)

Figure 18:
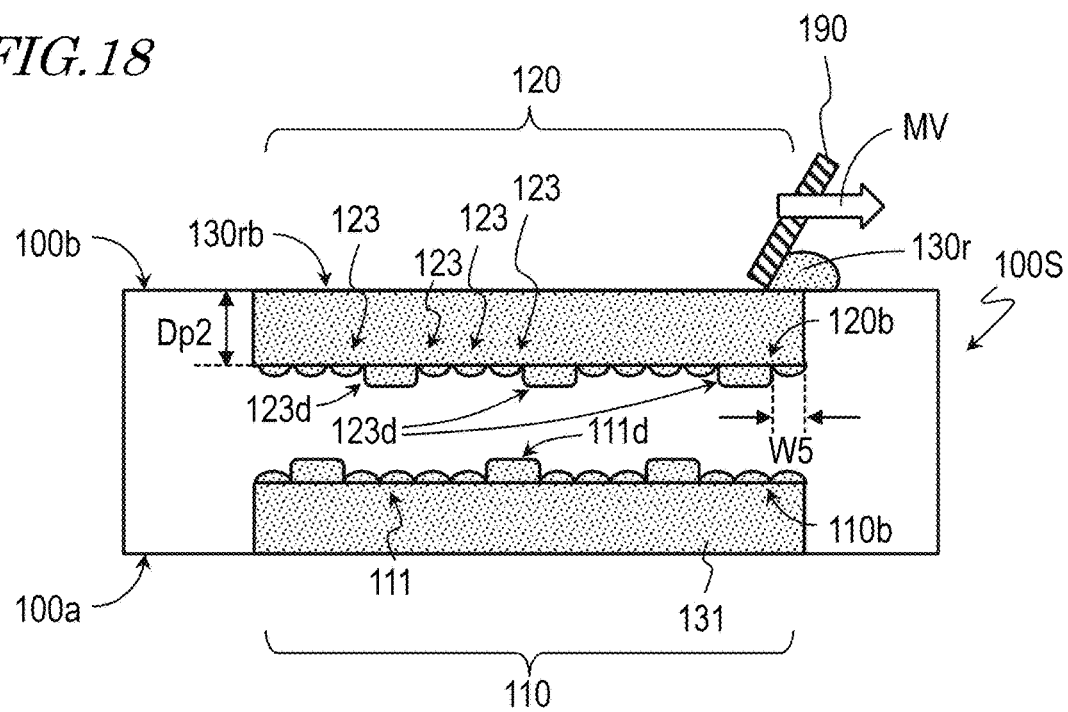
FIG. 18 is a schematic cross-sectional view illustrating a variation of a manufacturing method of a wiring board according to another embodiment of the present disclosure.

Subsequently, the second groove structure is filled with a second electrically-conductive material, whereby the second wiring pattern is formed of the second electrically-conductive material (step S6 of FIG. 14). As schematically shown in FIG. 18, the second groove structure 120 is filled with the second electrically-conductive material by printing with a squeegee 190. FIG. 18 is a schematic diagram showing an enlarged cross section of a part of the base 100S. FIG. 18 shows, for the sake of understandability, an example of a cross section of the base 100S taken at the intersection of the first groove structure 110 on the upper surface 100a side of the base 100S and the second groove structure 120 on the lower surface 100b side.

The second electrically-conductive material can be the same material as, or can be different material from, the above-described first electrically-conductive material. In the present embodiment, the above-described electrically-conductive paste 130r is used as the second electrically-conductive material. By moving the squeegee 190 across the lower surface 100b of the base 100S, the surface 130r b of the electrically-conductive paste 130r on the lower surface 100b side of the base 100S can be made substantially coplanar with the lower surface 100b of the base 100S. In placing the electrically-conductive paste 130r into the second groove structure 120, the inside of the third grooves 123 and the inside of the second recessed portions 123d are filled with an electrically-conductive paste 130r. As a matter of course, the method of applying the electrically-conductive paste 130r to the base 100S is not required to be printing.

As understood from FIG. 18, the second groove structure 120 includes a second bottom surface 120b formed by a set of the plurality of third grooves 123. By irradiating with laser light so as to overlap one or more third grooves 123, part of the second bottom surface 120b can further be removed, whereby the further irradiated second recessed portions 123d can be formed as deeper portions in the second bottom surface 120b. In the present embodiment, the second groove structure 120 can have a depth in the range of, for example, 5 to about 50 µm. The depth Dp2 of the second groove structure 120 is defined as the distance from the position of a plurality of apexes formed between two adjacent third grooves 123 to the lower surface 100b of the base 110S.

Figure 19:
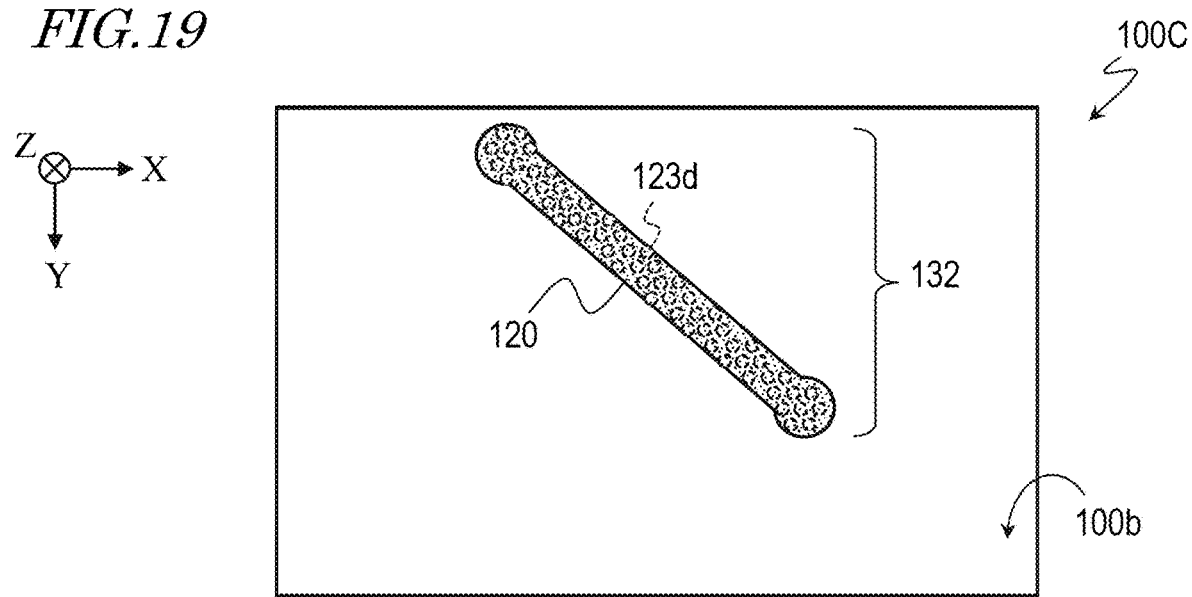
FIG. 19 is a schematic plan view illustrating a manufacturing method of a wiring board according to another embodiment of the present disclosure.

Subsequently, the second electrically-conductive material placed inside the second groove structure 120 is cured by heating or light irradiation. In the present embodiment, by curing the electrically-conductive paste 130r used as the second electrically-conductive material, a second wiring pattern 132 can be formed of the electrically-conductive paste 130r such that the second wiring pattern 132 has a shape that matches with the shape of the second groove structure 120 as viewed in the normal direction of the lower surface 100b of the base 100S as schematically shown in FIG. 19.

Figure 8:
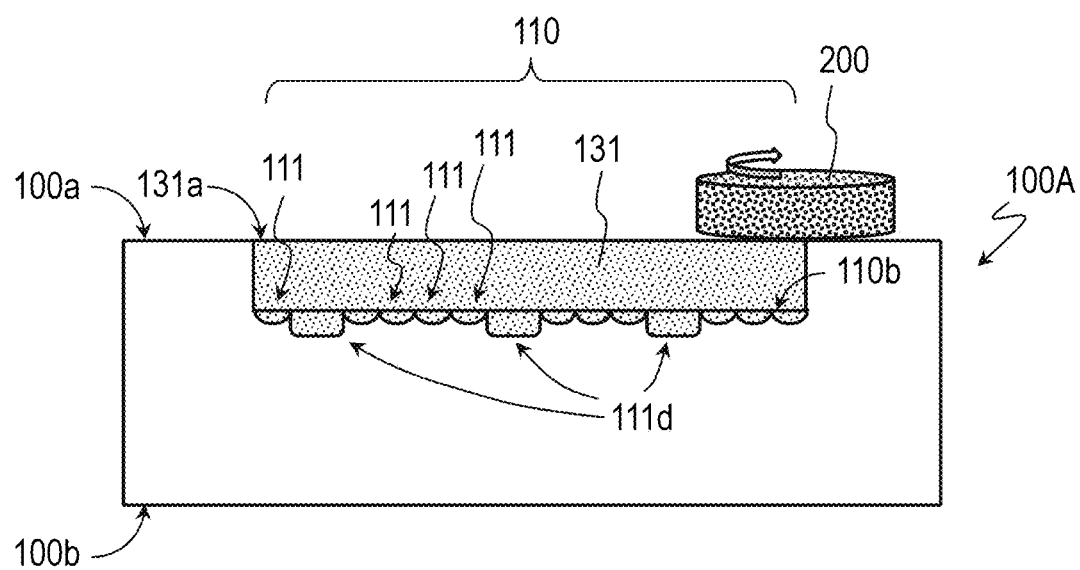
FIG. 8 is a schematic diagram for illustrating an additional grinding step in a manufacturing method of a wiring board according to an embodiment of the present disclosure.

After the electrically-conductive paste 130r has been cured, when necessary, a grinding step can additionally be carried out to grind the surface of the cured electrically-conductive paste 130r and the lower surface 100b of the base 100S in the same way as in the example shown in FIG. 8. By grinding, as schematically shown in FIG. 20, the surface 132b of the second wiring pattern 132 can be made coplanar with the lower surface 100b of the base 100S.

Through the above-described process, a wiring board 100C is obtained which includes the first wiring pattern 131 on the upper surface 100a side and the second wiring pattern 132 on the lower surface 100b side.

According to the present embodiment, the second wiring pattern 132 which has an appropriately determined shape can also be formed on the lower surface 100b side of the base 100S through a relatively simple process. The second groove structure 120 is formed by laser light irradiation likewise as the first groove structure 110, thus the shape of the second wiring pattern 132 can determined with highly flexible design, and wires with fine line width can relatively easily be formed with high accuracy. Further, wires with high aspect ratios can be realized. Thus, according to the present embodiment, a wiring board which includes fine wiring patterns with high aspect ratios on both opposing sides of the base 100S can be provided through a relatively simple process.

Figure 20:
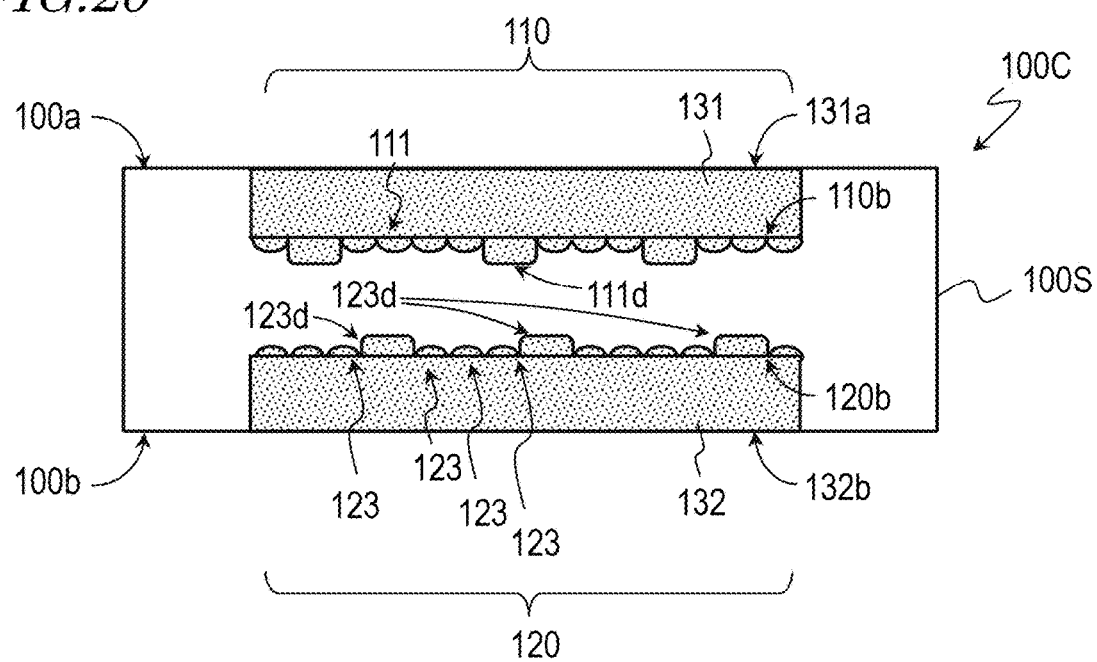
FIG. 20 is a schematic cross-sectional view corresponding to the plan view shown in FIG. 19.

In the example shown in FIG. 20, the surface (upper surface 131a) of the first wiring pattern 131 is coplanar with the upper surface 100a of the base 100S. The surface 132b of the second wiring pattern 132 is also coplanar with the lower surface 100b of the base 100S. Thus, according to the present embodiment, a thinner double-sided board can be provided in which protrusion of wiring from the surfaces of the base 100S is avoided.

Further, in the present embodiment, also on the lower surface 100b side of the base 100S, after formation of the second groove structure 120, the inside of the second groove structure 120 is further irradiated with laser light in an irradiation pattern which is different from that adopted in the step of forming the second groove structure 120 likewise as in formation of the first wiring pattern 131 on the upper surface 100a side of the base 100S. Thereby, additional concave and convex pattern can be formed in the second bottom surface 120b which includes the plurality of third grooves 123. For example, as previously described with reference to FIG. 17, the plurality of second recessed portions 123d having dot shapes in a plan view can be formed in the second bottom surface 120b. For example, by forming deeper portions having the shape of the second recessed portions 123d in the second bottom surface 120b, the area of the interface between the second wiring pattern 132 and the base 100S increases, thereby exerting a stronger anchoring effect. Thus, separation of the second wiring pattern 132 from the base 100S is alleviated, and thus the reliability of the wiring board can further improve.

Variations

A plurality of fourth grooves can be formed as described below, instead of forming the plurality of second recessed portions 123d having dot shapes in a plan view in the second bottom surface 120b by further irradiating the second bottom surface 120b of the second groove structure 120 with laser light, likewise as in the examples described with reference to FIG. 9 to FIG. 12 as for formation of the first wiring pattern 131.

Figure 21:
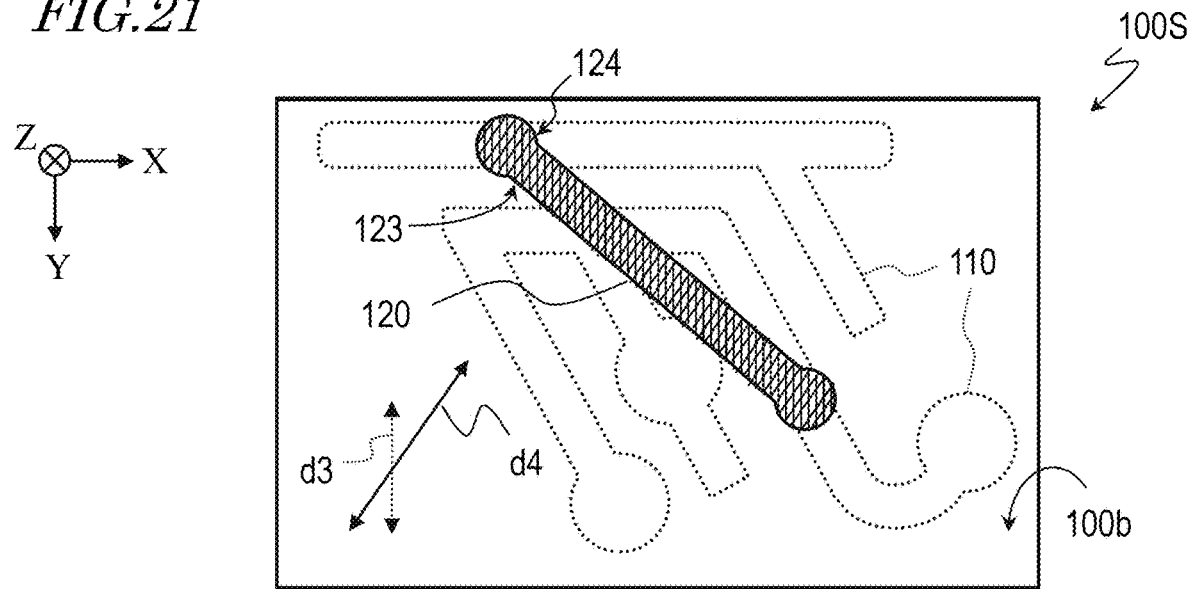
FIG. 21 is a diagram for illustrating a variation of a manufacturing method of a wiring board according to another embodiment of the present disclosure, more specifically.

FIG. 21 schematically shows a resultant structure after the inside of the second groove structure 120 is irradiated with a laser light beam LB in an irradiation pattern which is different from that adopted in formation of the second groove structure 120 after the second groove structure 120 is formed. In the example shown in FIG. 21, for example, by scanning along the above-described fourth direction, a plurality of fourth grooves 124 each extending in the fourth direction are further formed inside the second groove structure 120. The fourth grooves 124 are the same as or similar to the third grooves 123. In the present embodiment, a direction different from the third direction is selected as the fourth direction. That is, each of the plurality of fourth grooves 124 extends in a direction different from that of the plurality of third grooves 123.

Figure 22:
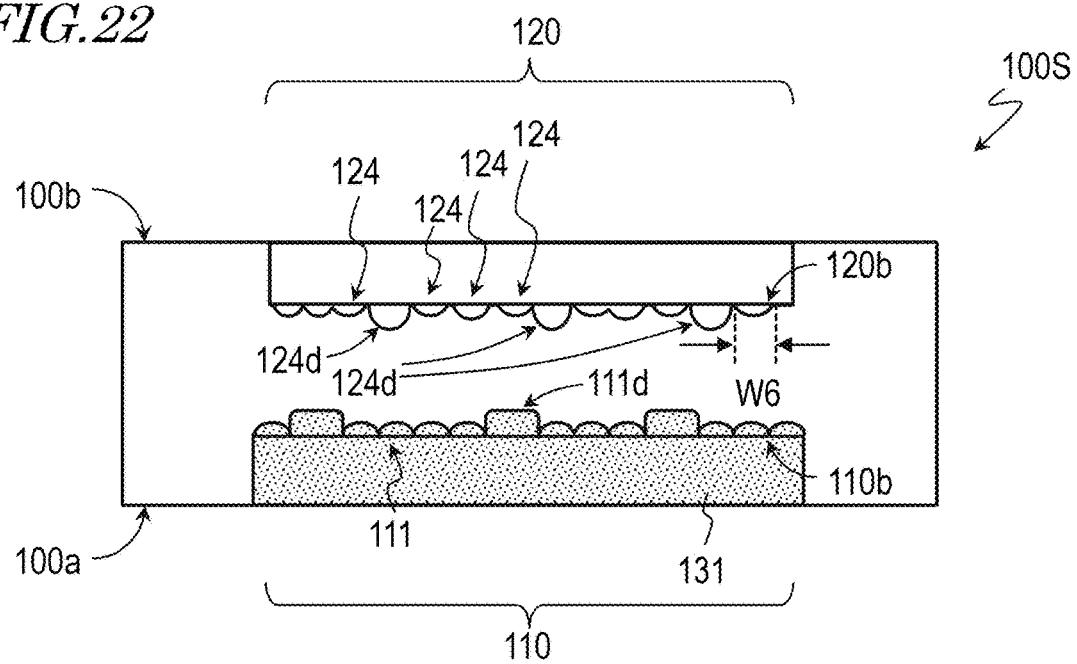
FIG. 22 is a schematic cross-sectional view enlarging a cross section of a part of the base 100S shown in FIG. 21.

FIG. 22 shows an enlarged cross section of a part of the base 100S shown in FIG. 21. The fourth direction in the irradiation, which is the scanning direction on the second bottom surface 120b of the second groove structure 120 with the laser light beam LB, is different from the third direction in which the plurality of third grooves 123 extend. In this example, the second bottom surface 120b is partially removed by further irradiating the second bottom surface 120b of the second groove structure 120 with laser light, and as a result, the plurality of fourth grooves 124 are formed in the second bottom surface 120b.

As schematically shown in FIG. 22, each of the plurality of fourth grooves 124 has a sixth width W6. The sixth width W6 is smaller than the fourth width W4 of the second groove structure 120 (see FIG. 15). The values set for the laser power, the pulse interval and the like in the step of forming the plurality of fourth grooves 124 can be equal to, or can be different from, those in the step of forming the plurality of third grooves 123. Also, the arrangement pitch of the fourth grooves 124 can be equal to, or can be different from, that of the third grooves 123.

By forming the plurality of fourth grooves 124 so as to overlap the plurality of third grooves 123, deeper portions can be formed at the intersections of the third grooves 123 and the fourth grooves 124. These relatively deep portions can be recessed portions having dot shapes in a plan view, which are the same as or similar to the plurality of second recessed portions 123d. Hereinafter, these deeper portions are also referred to as "second recessed portions 124d" for the sake of convenience.

Figure 23:
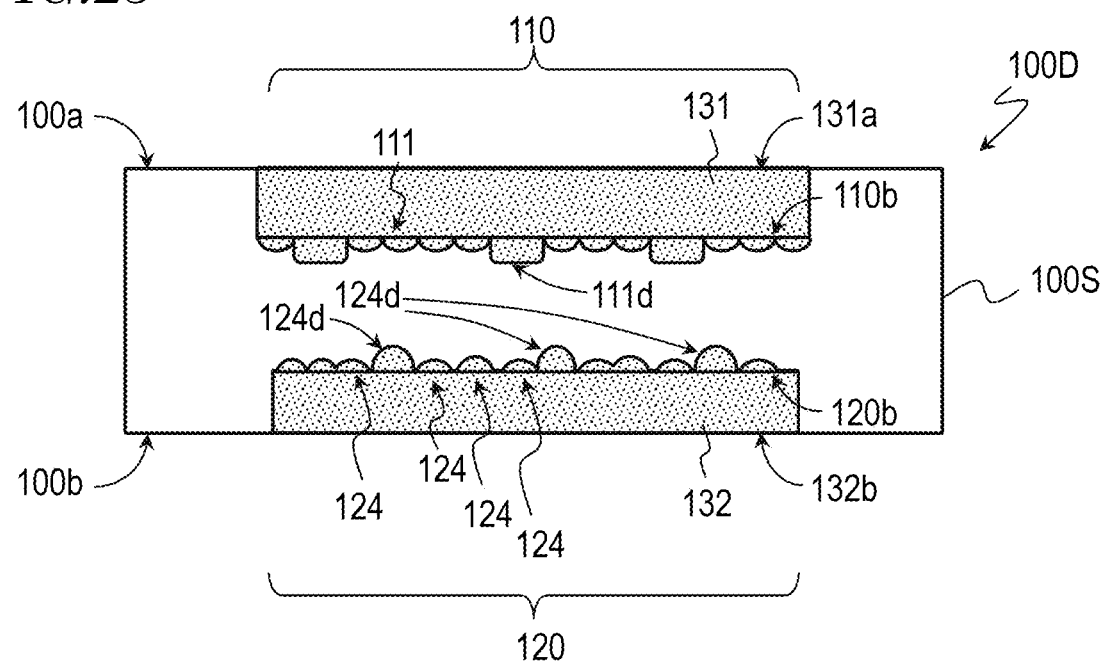
FIG. 23 is a schematic cross-sectional view of a resultant structure after a second wiring pattern is formed in the structure shown in FIG. 22.

FIG. 23 schematically shows a resultant structure after a second wiring pattern is formed in the structure shown in FIG. 22. Likewise, as in the example described with reference to FIG. 18, the inside of the second groove structure 120 is filled with the second electrically-conductive material, whereby a second wiring pattern 132 whose shape matches with the shape of the second groove structure 120 can be formed.

A wiring board 100D shown in FIG. 23 includes the second wiring pattern 132 positioned inside the second groove structure 120 on the lower surface 100b side of the base 100S as does the above-described wiring board 100C. As in this example, the plurality of fourth grooves 124 which intersect the plurality of third grooves 123 are formed by laser light irradiation in an irradiation pattern which is different from that adopted in formation of the plurality of third grooves 123, whereby a plurality of second recessed portions 124d can further be formed inside the second groove structure 120. Also by forming the plurality of fourth grooves 124 so as to overlap the plurality of third grooves 123, instead of forming the plurality of second recessed portions 123d having dot shapes in a plan view, a wiring board which has fine wiring patterns with high aspect ratios on both opposing sides of the base 100S, and hence has improved reliability, can be provided.

By forming the plurality of second recessed portions 124d, part of the second wiring pattern 132 can be provided not only inside the plurality of third grooves 123 and the plurality of fourth grooves 124 but also inside the second recessed portions 124d. Therefore, by further forming the plurality of fourth grooves 124, which are thinner than the second groove structure 120, in the second bottom surface 120b of the second groove structure 120, the area of the interface between the second wiring pattern 132 and the base 100S increases, thereby further improving the anchoring effect. Thus, separation of the second wiring pattern 132 from the base 100S is alleviated, and thus the effect of improving the reliability of the wiring board can be expected.

Figure 24:
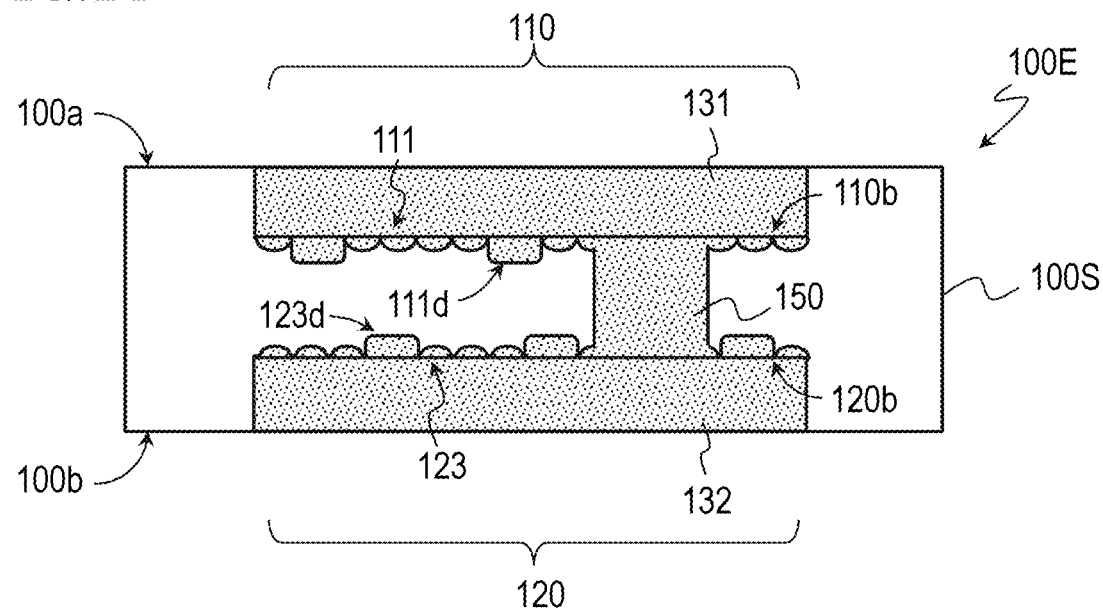
FIG. 24 is a schematic cross-sectional view showing still another variation of a wiring board according to Embodiment 2 of the present disclosure.

FIG. 24 shows still another variation of the wiring board according to Embodiment 2 of the present disclosure. The wiring board 100E shown in FIG. 24 includes: a base 100S in which a first groove structure 110 and a second groove structure 120 are respectively formed on the upper surface 100a side and the lower surface 100b side; a first wiring pattern 131 provided inside the first groove structure 110; a second wiring pattern 132 provided inside the second groove structure 120; and at least one via 150 formed inside the base 100S.

An example configuration is described as follows with reference to FIG. 24. The first groove structure 110 has a first bottom surface 110b on which a set of a plurality of first grooves 111 is formed. On the first bottom surface 110b, a plurality of first recessed portions 111d is formed likewise as in the example of the wiring board 100A shown in FIG. 8.

The second groove structure 120 has a second bottom surface 120b on which a set of a plurality of third grooves 123 is formed. On the second bottom surface 120b, a plurality of second recessed portions 123d is formed likewise as in the example of the wiring board 100C shown in FIG. 20.

As schematically shown in FIG. 24, one end of the via 150 is connected with the first wiring pattern 131 on the upper surface 100a side of the base 100S, and the other end of the via 150 is connected with the second wiring pattern 132 on the lower surface 100b side thereof. That is, the via 150 passing through the base 100S electrically couples the first wiring pattern 131 and the second wiring pattern 132 with each other. In FIG. 24, only one via 150 is shown to avoid an excessively complicated drawing, although the number of vias 150 and the arrangement of vias 150 can be appropriately determined. When the wiring board is cut by a plane parallel to the upper surface 100a or the lower surface 100b, the cross-sectional shape of the via 150 is not necessarily be a particular shape.

As previously described, in an embodiment of the present disclosure, the first groove structure 110 and the second groove structure 120 are formed by scanning with the laser light beam LB, and thus the shape in a plan view can be determined with highly flexible design configurations. The first wiring pattern 131 formed inside the first groove structure 110 and the second wiring pattern 132 formed inside the second groove structure 120 have planar shapes which match with the first groove structure 110 and the second groove structure 120, respectively. That is, by appropriately determining the irradiation pattern of the laser light, the first wiring pattern 131 and the second wiring pattern 132 having desired planar shapes can be easily obtained. Therefore, according to the present embodiment, an interposer can be provided which has wiring patterns of desired shapes on both opposing sides of the base, and which has an electrical conduction path coupling these wiring patterns inside the base, while avoiding complicated processes.

Figure 25:
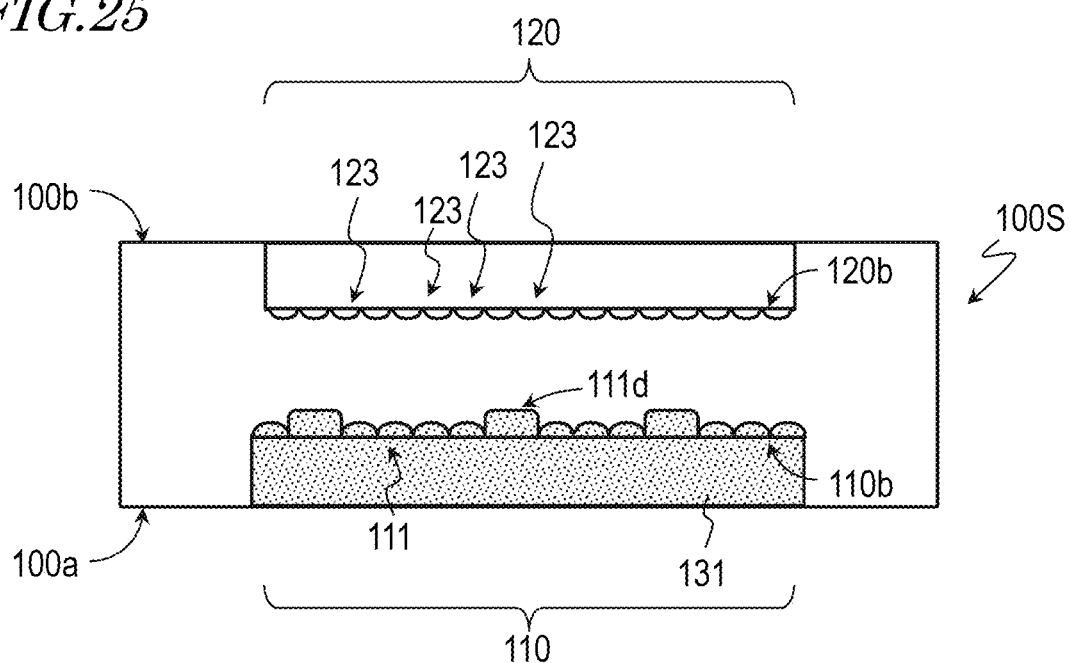
FIG. 25 is a schematic cross-sectional view illustrating an exemplary manufacturing method of a wiring board 100E shown in FIG. 24.

Hereinafter, the outline of an exemplary manufacturing method of the wiring board 100E shown in FIG. 24 is described. First, likewise as in the examples described with reference to FIG. 2 to FIG. 7, a first wiring pattern 131 is formed on the upper surface 100a side of the base 100S. Then, for example, likewise as in the examples described with reference to FIG. 15 and FIG. 16, a second groove structure 120 is formed on the lower surface 100b side of the base 100S. FIG. 25 schematically shows the base 100S on which the second groove structure 120 is formed.

Through Hole Formation Step (G)

Figure 26:
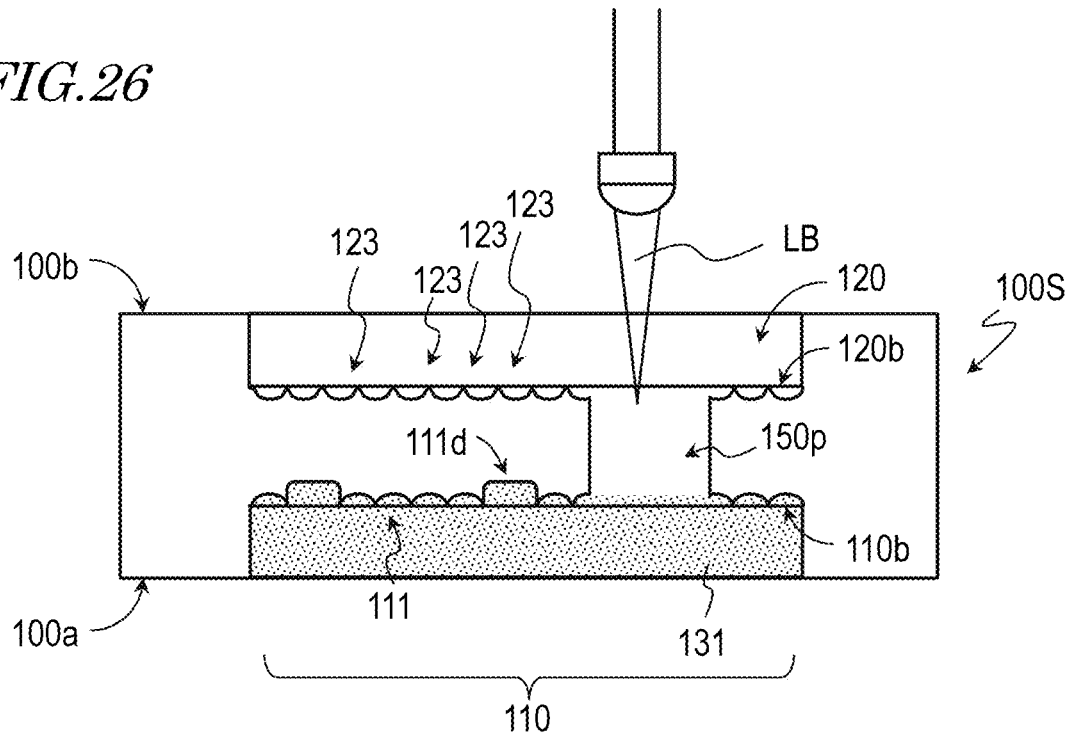
FIG. 26 is a schematic cross-sectional view illustrating an exemplary manufacturing method of the wiring board 100E shown in FIG. 24.

Subsequently, a through hole is formed by laser light irradiation such that the first groove structure 110 on the upper surface 100a side of the base 100S and the second groove structure 120 on the lower surface 100b side communicate with each other. For example, when a CO$_2$ laser is used, the second bottom surface 120b can be irradiated with a laser light beam LB having a greater laser power as compared with that used in formation of the plurality of third grooves 123. Accordingly, a through hole 150p extending from the second bottom surface 120b to the first groove structure 110 can be formed inside the base 100S as schematically shown in FIG. 26. Alternatively, when a YAG laser is used, a laser irradiation spot is moved circularly around the center of a region of the second bottom surface 120b in which the through hole 150p is to be formed, whereby the through hole 150p can be formed. The position of the through hole 150p can be arbitrarily determined so long as it is at the position where the first groove structure 110 overlaps the second groove structure 120 as seen from the top. The number of through holes 150p can be arbitrarily determined.

Figure 27:
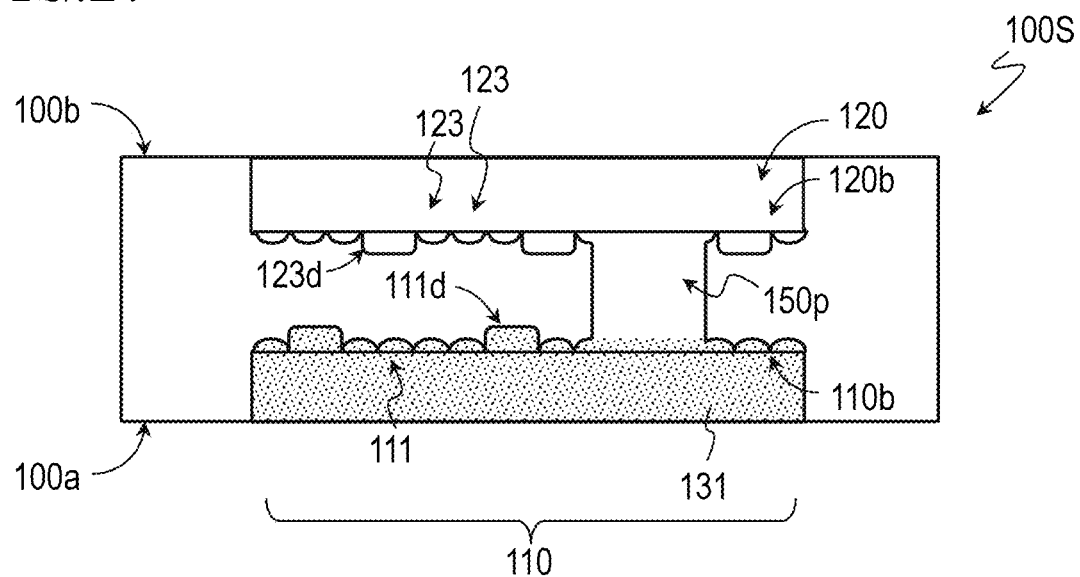
FIG. 27 is a schematic cross-sectional view illustrating an exemplary manufacturing method of the wiring board 100E shown in FIG. 24.

Then, the above-described second irradiation step (E) is performed. Specifically, likewise as in the example described with reference to FIG. 17, the inside of the second groove structure 120 is further irradiated with laser light such that a plurality of second recessed portions 123d having, for example, dot shape are formed in the second bottom surface 120b. FIG. 27 schematically shows the base 100S on which the plurality of second recessed portions 123d are formed in the second bottom surface 120b. Instead of the plurality of second recessed portions 123d, likewise as in the examples described with reference to FIG. 21 and FIG. 22, by forming the plurality of fourth grooves 124 in the second bottom surface 120b so as to intersect the plurality of third grooves 123, the plurality of second recessed portions 124d can be formed at the intersections of the third grooves 123 and the fourth grooves 124. In the example described in the present embodiment, although the plurality of first recessed portions 111d are provided in the bottom portion of the first groove structure 110, instead of the plurality of first recessed portions 111d, a plurality of first recessed portions 112d can be formed at the intersections of the first grooves 111 and the second grooves 112 by forming the plurality of second grooves 112 in the first bottom surface 110b. Various configurations described in this specification can be used in arbitrary combinations so long as no technical inconsistency occurs.

Figure 28:
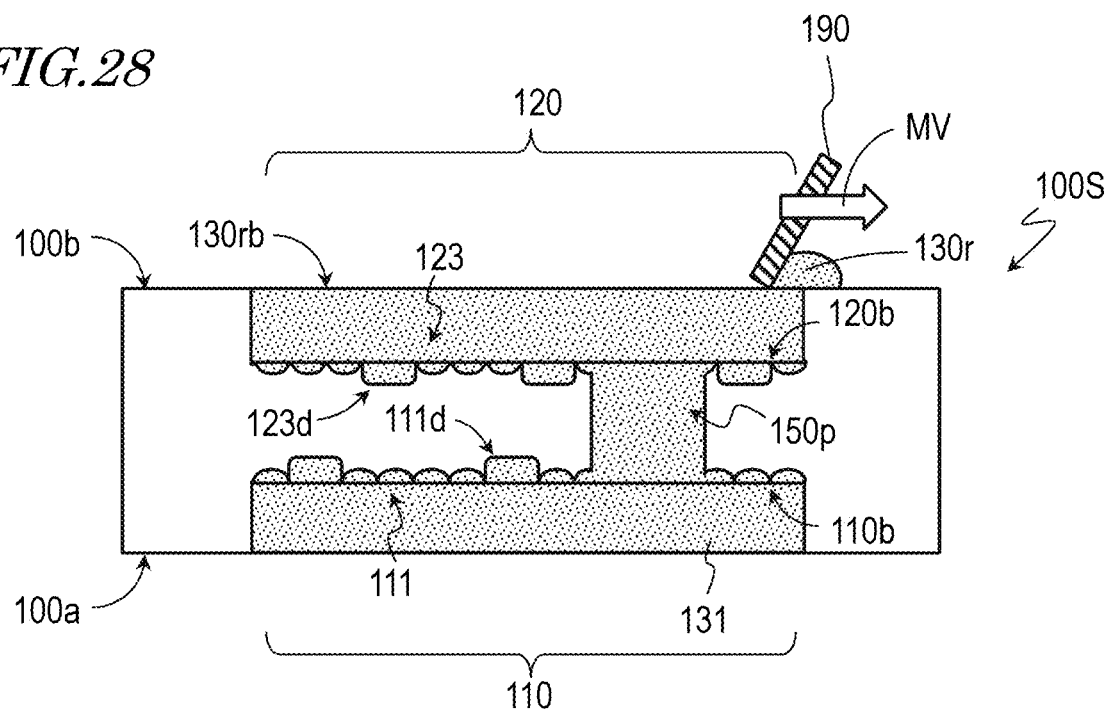
FIG. 28 is a schematic cross-sectional view illustrating an exemplary manufacturing method of the wiring board 100E shown in FIG. 24.
Figure 29:
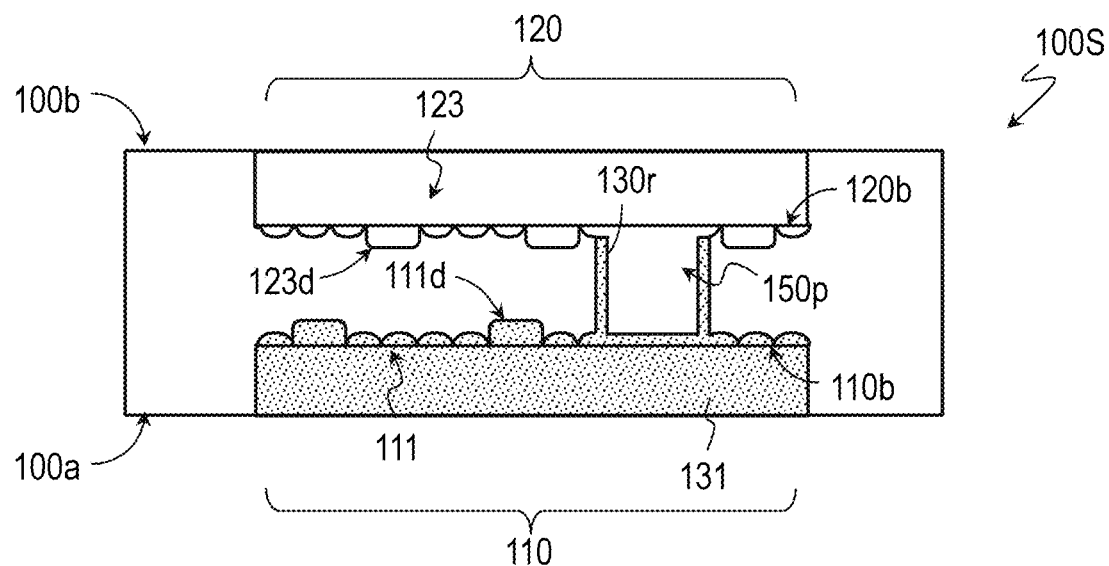
FIG. 29 is a schematic cross-sectional view showing a variation in which an electrically-conductive paste 130r is selectively applied onto the inner surface of a through hole 150p.

Then, the above-described second wiring pattern formation step (F) is performed. However, in the present embodiment, the second electrically-conductive material is placed not only inside the second groove structure 120 but also inside the through hole 150p. In the example shown in FIG. 28, the second groove structure 120 and the through hole 150p are filled with an electrically-conductive paste 130r used as the second electrically-conductive material by printing with the squeegee 190. According to the technique of filling while creating a vacuum, so-called vacuum printing, the through hole 150p can be filled with the electrically-conductive paste 130r while alleviating entry of air. In this step, the electrically-conductive paste 130r typically occupies the entire space defined by the inner surface of the through hole 150p as shown in FIG. 28. However, the present invention is not limited to this example. As schematically shown in FIG. 29, the electrically-conductive paste 130r can be selectively applied to the inner surface of the through hole 150p. In this case, the inner space of a cylindrical film of the electrically-conductive paste 130r formed in the through hole 150p can be filled with a resin or the like.

Then, the electrically-conductive paste 130r as the second electrically-conductive material placed inside the second groove structure 120 and inside the through hole 150p is cured. By curing the electrically-conductive paste 130r, a via 150 is formed by a part of the electrically-conductive paste 130r which is present inside the through hole 150p. The via 150 enables the first wiring pattern 131 on the upper surface 100a side of the base 100S to be coupled with the second wiring pattern 132 on the lower surface 100b side. Through the process described hereinabove, the wiring board 100E shown in FIG. 24 is obtained.

According to the example described herein, the electrical conduction path between the upper surface 100a side and the lower surface 100b side of the base 100S can be formed relatively easily. The first wiring pattern 131 on the upper surface 100a side of the base 100S and the second wiring pattern 132 on the lower surface 100b side are not only electrically coupled but also physically connected with each other by the via 150. Therefore, formation of the via 150 can more effectively alleviate separation of the wiring patterns from the base. That is, a double-sided board in which separation of the wiring patterns from the base is alleviated can be provided while avoiding complicated processes.

Figure 30:
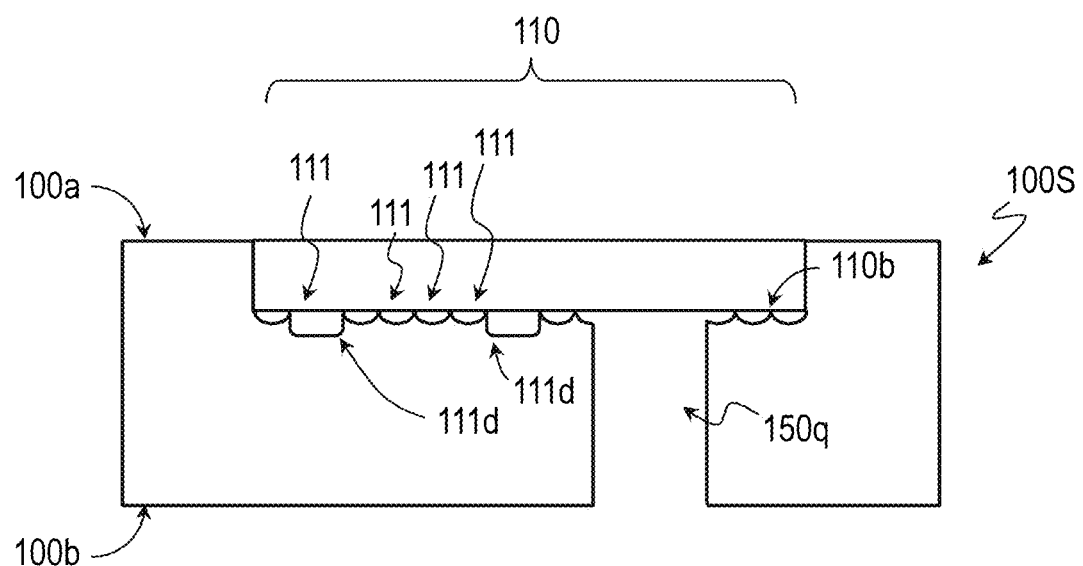
FIG. 30 is a schematic cross-sectional view showing a variation in which a through hole 150q is formed in the base 100S before formation of the second groove structure 120.

In the example described herein, the step of forming the through hole 150p is performed between the second groove structure formation step (D) and the second irradiation step (E). However, the timing of the step of forming the through hole is not required to be this example. The step of forming the through hole can be performed, for example, concurrently with the second groove structure formation step (D) that is performed to form the plurality of third grooves 123 forming the second bottom surface 120b of the second groove structure 120, or can be performed after the plurality of second recessed portions 123d or the plurality of fourth grooves 124 are formed. Alternatively, as shown in FIG. 30, a through hole can be formed in the base 100S by laser processing, punching, processing with a NC lathe, or the like, before formation of the second groove structure 120. The processing method applied to formation of the through hole can be appropriately selected according to the material of the base 100S.

In the example shown in FIG. 30, one of the openings of a through hole 150q extending from the first bottom surface 110b of the first groove structure 110 to the lower surface 100b of the base 100S is present at the lower surface 100b of the base 100S. Placement of the electrically-conductive material into the through hole 150q can be carried out at the step of filling the inside of the first groove structure 110 with the first electrically-conductive material, or can be carried out at the step of filling the inside of the second groove structure 120 with the second electrically-conductive material.

When the base 100S is a ceramic substrate, a through hole can be formed by punching or the like in a green sheet before being baked so as to extend between the front surface and the rear surface of the green sheet. The first groove structure 110 can be formed in a base in which a via is formed beforehand. Alternatively, a via can be formed in the base 100S before formation of the first groove structure 110. In this case, part of the via can be removed by laser light irradiation.

EXAMPLES

Hereinafter, examples of a wiring board of an embodiment of the present disclosure will be described in more detail. As a matter of course, an embodiment of the present disclosure is not required to forms specified by the following examples.

Evaluation 1: Shape of Bottom Portion of Groove Structure

A plurality of samples were provided by scanning a white resin plate with a laser light beam to form a groove structure was formed in one of the principal surfaces of the resin plate, and a bottom portion of the groove structure was further irradiated with laser light in a different irradiation pattern. These samples were evaluated as to the shape of the bottom portion of the groove structure.

Example 1-1

First, a resin plate was provided in which particles of titanium dioxide were dispersed in a silicone resin that is a base material. Then, one of the principal surfaces of this resin plate was scanned with a laser light beam in a certain direction (i.e., first direction) such that a plurality of first grooves each extending in the first direction were formed in the resin plate (corresponding to the previously-described first groove structure formation step). In the present example, scanning with the laser light beam was carried out in five different regions of the principal surface of the resin plate, whereby a first groove structure was formed in the plate such that the first groove structure included five portions each having a first bottom surface defined by a set of a plurality of first grooves. The irradiation conditions of the laser light in this step are as follows:

Peak wavelength of the laser light: 532 nm;
Laser power: 2.4 W;
Pulse width: 100 nanoseconds;
Frequency: 50 kHz;
Operation Speed: 200 mm/s;
Defocus: 0 μm;
Pitch of the first grooves: 15 μm or 30 μm.

Subsequently, from the five portions included in the first groove structure, a portion in which the pitch of the first grooves was 15 μm was selected at random, scanning with a laser light beam was carried out in the second direction that intersects the first direction, and the bottom portion of the selected portion (hereinafter, referred to as "first portion") was irradiated with a laser light beam (corresponding to the previously-described first irradiation step). Thereby, a plurality of first recessed portions having dot shapes were formed in the bottom portion of the first portion likewise as in the examples described with reference to FIG. 4 and FIG. 5. This was the sample of Example 1-1. In the present example, a direction selected as the second direction was perpendicular to the first direction. When viewed from the top, each of the first recessed portions had a diameter of about 0.1 mm. The irradiation conditions of the laser light in this step are as follows:

Peak wavelength of the laser light: 532 nm;
Laser power: 2.4 W;
Pulse width: 100 nanoseconds;
Frequency: 50 kHz;
Operation Speed: 200 mm/s;
Defocus: 0 μm;
Distance between the centers of the first recessed portions: 15 μm.

Figure 31:
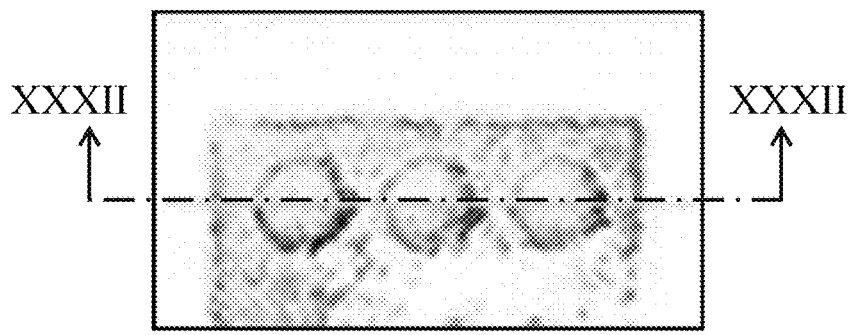
FIG. 31 shows a microscopic image of the first bottom surface of the sample of Example 1-1.
Figure 32:
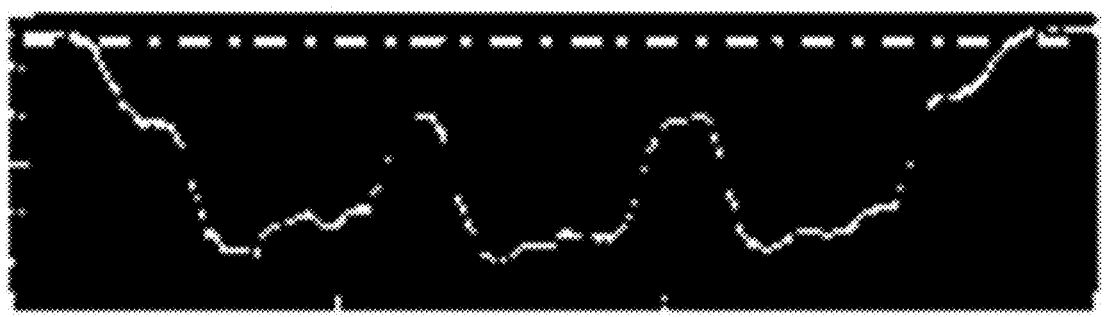
FIG. 32 shows a cross-sectional profile of the sample of Example 1-1.

FIG. 31 is an enlarged microscopic image showing the first bottom surface of the sample of Example 1-1. FIG. 32 shows a cross-sectional profile of the sample of Example 1-1 which was obtained by a laser microscope and which corresponds to a cross-sectional view taken along line XXXII-XXXII of FIG. 31. In FIG. 32, the horizontal dot-chain line represents the position of the surface of the resin plate before formation of the first groove structure. As shown in FIG. 31, in the present disclosure, the bottom portion of the first portion has three first recessed portions aligned in the horizontal direction of the drawing page. In the cross-sectional profile shown in FIG. 32, the average depth of the three first recessed portions was about 120 μm.

Example 1-2

From the five portions included in the first groove structure, another portion in which the pitch of the first grooves was 15 μm was selected at random, and the bottom portion of the portion selected herein (hereinafter, referred to as "second portion") was irradiated with a laser light beam under the same laser light irradiation conditions as those for Example 1-1 except that the laser power was 1.2 W and the frequency was changed such that the distance between the centers of the first recessed portions was 60 μm. Thereby, a plurality of first recessed portions having dot shapes were formed in the bottom portion of the second portion. This was the sample of Example 1-2.

Figure 33:
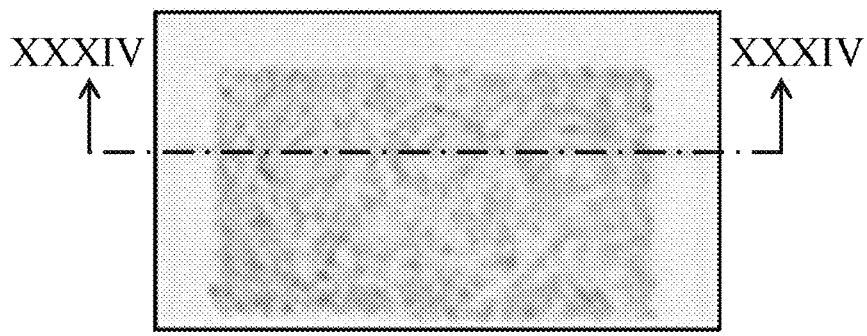
FIG. 33 shows a microscopic image of the first bottom surface of the sample of Example 1-2.
Figure 34:
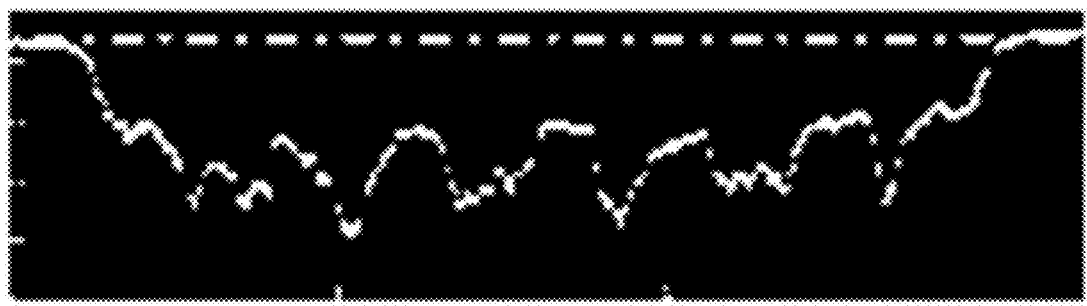
FIG. 34 shows a cross-sectional profile of the sample of Example 1-2.

FIG. 33 is an enlarged microscopic image showing the first bottom surface of the sample of Example 1-2. FIG. 34 shows a cross-sectional profile of the sample of Example 1-2 which was obtained by a laser microscope and which corresponds to a cross-sectional view taken along line XXXIV-XXXIV of FIG. 33. In FIG. 34, likewise as in FIG. 32, the horizontal dot-chain line represents the position of the surface of the resin plate before formation of the first groove structure. The bottom portion has three first recessed portions aligned along the XXXIV-XXXIV line likewise as in the example shown in FIG. 31, although it is difficult to confirm in FIG. 33. In the cross-sectional profile shown in FIG. 34, the average depth of the three first recessed portions was about 50 μm.

Example 1-3

From the five portions included in the first groove structure, a portion in which the pitch of the first grooves was 30 μm was selected at random, and the bottom portion of the portion selected herein (hereinafter, referred to as "third portion") was irradiated with a laser light beam under the same laser light irradiation conditions as those for Example 1-2 except that the frequency was changed such that the distance between the centers of the first recessed portions was 30 μm. Thereby, a plurality of first recessed portions having dot shapes were formed in the bottom portion of the third portion. This was the sample of Example 1-3.

Figure 35:
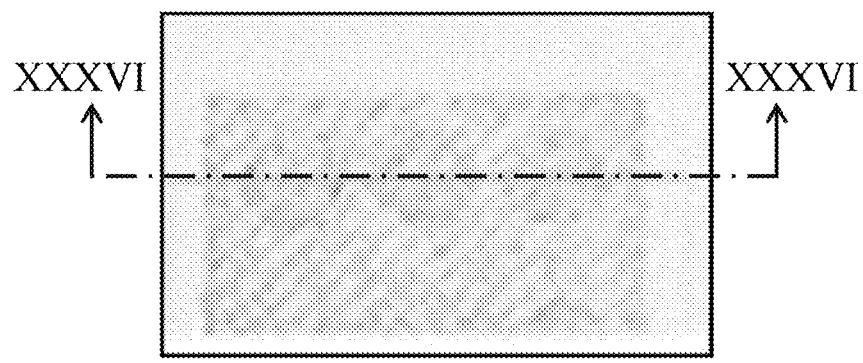
FIG. 35 shows a microscopic image of the first bottom surface of the sample of Example 1-3.
Figure 36:
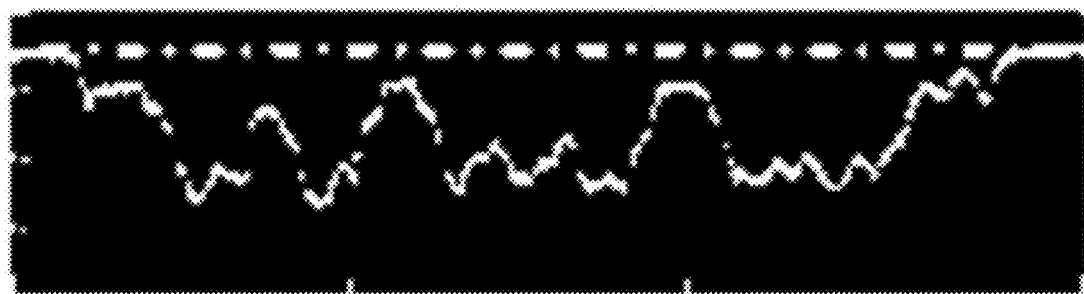
FIG. 36 shows a cross-sectional profile of the sample of Example 1-3.

FIG. 35 is an enlarged microscopic image showing the first bottom surface of the sample of Example 1-3. FIG. 36 shows a cross-sectional profile of the sample of Example 1-3 which was obtained by a laser microscope and which corresponds to a cross-sectional view taken along line XXXVI-XXXVI of FIG. 35. In FIG. 36, the horizontal dot-chain line represents the position of the surface of the resin plate before formation of the first groove structure. Also, in this example, the bottom portion has three first recessed portions aligned along the XXXVI-XXXVI line likewise as in the examples shown in FIG. 31 and FIG. 33, although it is difficult to confirm in FIG. 35. In the cross-sectional profile shown in FIG. 36, the average depth of the three first recessed portions was about 40 μm.

Example 1-4

From the five portions included in the first groove structure, another portion in which the pitch of the first grooves was 30 μm was selected at random, and the bottom portion of the portion selected herein (hereinafter, referred to as "fourth portion") was irradiated with a laser light beam under the same laser light irradiation conditions as those for Example 1-3 except that the frequency was changed such that the distance between the centers of the first recessed portions was 60 μm. Thereby, a plurality of first recessed portions having dot shapes were formed in the bottom portion of the fourth portion. This was the sample of Example 1-4.

Figure 37:
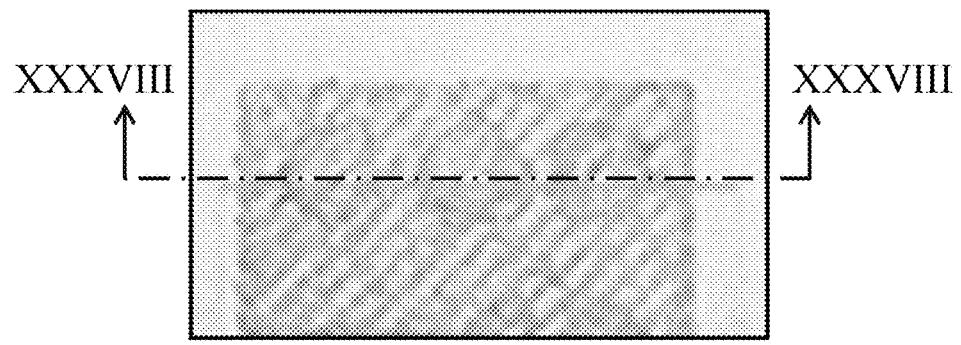
FIG. 37 shows a microscopic image of the first bottom surface of the sample of Example 1-4.
Figure 38:
FIG. 38 shows a cross-sectional profile of the sample of Example 1-4.

FIG. 37 is an enlarged microscopic image showing the first bottom surface of the sample of Example 1-4. FIG. 38 shows a cross-sectional profile of the sample of Example 1-4 which was obtained by a laser microscope and which corresponds to a cross-sectional view taken along line XXXVIII-XXXVIII of FIG. 37. In FIG. 38, the horizontal dot-chain line represents the position of the surface of the resin plate before formation of the first groove structure. Also, in this example, the bottom portion has three first recessed portions aligned along the XXXVIII-XXXVIII line likewise as in the examples shown in FIG. 31, FIG. 33 and FIG. 35, although it is difficult to confirm in FIG. 37. In the cross-sectional profile shown in FIG. 38, the average depth of the three first recessed portions was about 38 μm.

Reference Example 1-1

The bottom portion of the remaining one of the five portions included in the first groove structure (hereinafter, referred to as "fifth portion") was irradiated with a laser light beam under the same laser light irradiation conditions as those for Example 1-2 except that the operation speed was changed to 500 mm/s. Thereby, a plurality of first recessed portions having dot shapes were formed in the bottom portion of the fifth portion. This was the sample of Reference Example 1-1.

Figure 39:
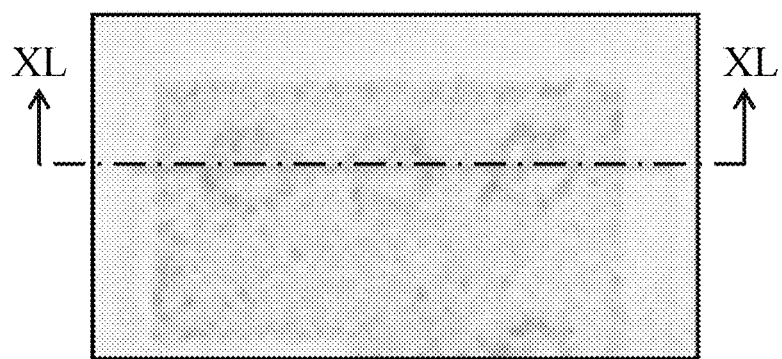
FIG. 39 shows a microscopic image of the first bottom surface of the sample of Reference Example 1-1.
Figure 40:
FIG. 40 shows a cross-sectional profile of the sample of Reference Example 1-1.

FIG. 39 is an enlarged microscopic image showing the first bottom surface of the sample of Reference Example 1-1. FIG. 40 shows a cross-sectional profile of the sample of Reference Example 1-1 which was obtained by a laser microscope and which corresponds to a cross-sectional view taken along line XL-XL of FIG. 39. In FIG. 40, the horizontal dot-chain line represents the position of the surface of the resin plate before formation of the first groove structure. Also, in this example, the bottom portion has three first recessed portions aligned along the XL-XL line likewise as in the examples shown in FIG. 31, FIG. 33, FIG. 35 and FIG. 37, although it is difficult to confirm in FIG. 39. In the cross-sectional profile shown in FIG. 40, the average depth of the three first recessed portions was about 22 μm.

With reference to the cross-sectional profiles of the samples of Example 1-1 to Example 1-4 (FIG. 32, FIG. 34, FIG. 36 and FIG. 38) and the cross-sectional profile of the sample of Reference Example 1-1 (FIG. 40), it was found that a plurality of apexes formed between two adjacent first grooves were at a position lower than the surface of the resin plate before formation of the first groove structure. That is, in these samples, the position of the first bottom surface is lower than the surface of the resin plate before formation of the first groove structure. Therefore, when the first electrically-conductive material is placed inside the first groove structure, the first electrically-conductive material is in contact not only with the bottom portion of the first groove structure but also with the lateral surfaces of the first groove structure which are present between the bottom portion and the surface of the resin plate. Accordingly, exhibit of the anchoring effect is expected at the interfaces between the lateral surfaces of the first groove structure and the first electrically-conductive material.

As seen from the comparison between the cross-sectional profiles of the samples of Example 1-1 to Example 1-4 and the cross-sectional profile of the sample of Reference Example 1-1, the recessed and raised portions formed in the region irradiated with the laser light in the sample of Reference Example 1-1 are not so large. That is, when a plurality of first recessed portions having dot shapes are formed in the first bottom surface in the first irradiation step, it is preferred that the operation speed of the laser irradiation is not excessively high from the viewpoint of forming first recessed portions with an appropriate depth in the first bottom surface. As seen from the comparison between the cross-sectional profile of the sample of Example 1-1 and the cross-sectional profiles of the samples of Example 1-2 to Example 1-4, it is found that, if at equal operation speed, recessed and raised portions tends to be finer shapes when the laser power is restricted within a certain range.

Evaluation 1: Shape of First Wiring Pattern

Subsequently, the first groove structure was filled with an electrically-conductive paste, and the electrically-conductive paste was cured, whereby the first wiring pattern was formed in the first groove structure (corresponding to the previously-described first wiring pattern formation step). It was checked by cross-sectional observation whether the first wiring pattern had a shape following the shape of the bottom portion of the first groove structure.

Example 1-5

Through the following procedure, the second portion of the sample of Example 1-2 was filled with an electrically-conductive paste, and the electrically-conductive paste was cured, whereby the sample of Example 1-5 was produced. In the present example, the second portion was filled with an electrically-conductive paste by printing with a squeegee and, thereafter, the resin plate filled with an electrically-conductive paste was placed in a 130° C. environment for 30 minutes such that the electrically-conductive paste was cured, whereby the first wiring pattern was formed inside the second portion.

Figure 41:
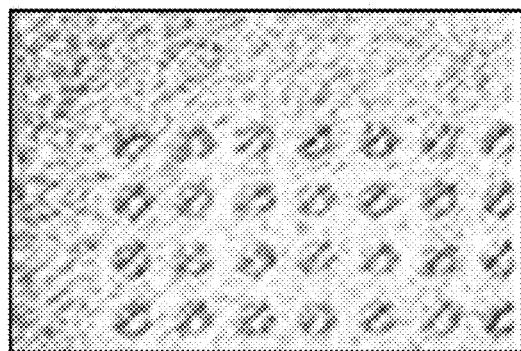
FIG. 41 shows a microscopic image of the second portion before being filled with an electrically-conductive paste.
Figure 42:
FIG. 42 shows a microscopic image of a cross section after the second portion was filled with an electrically-conductive paste and the electrically-conductive paste was cured.

FIG. 41 is a microscopic image showing the second portion before being filled with an electrically-conductive paste. A plurality of first grooves running in a diagonal direction in the drawing page and a plurality of first recessed portions can be seen. FIG. 42 shows a cross section after the second portion was filled with an electrically-conductive paste, and the electrically-conductive paste was cured. In the following description, the diagram for the cross section after the electrically-conductive paste was cured shows a cross section obtained by cutting the range of about 4 mm square.

Example 1-6

Figure 43:
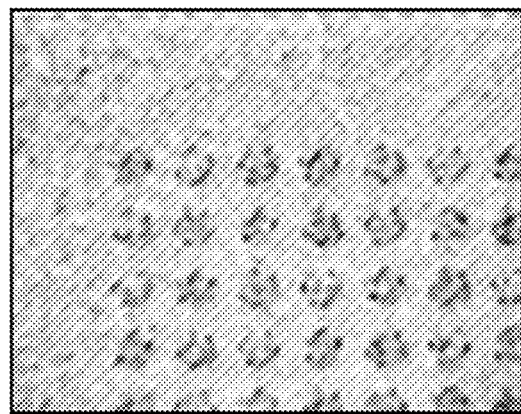
FIG. 43 shows a microscopic image of the third portion before being filled with an electrically-conductive paste.
Figure 44:
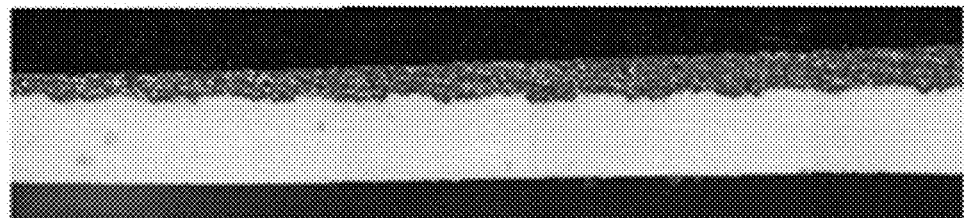
FIG. 44 shows a microscopic image of a cross section after the third portion was filled with an electrically-conductive paste and the electrically-conductive paste was cured.

The sample of Example 1-6 was produced likewise as the sample of Example 1-5 except that the third portion of the sample of Example 1-3 was filled with an electrically-conductive paste. FIG. 43 is a microscopic image showing the third portion before being filled with an electrically-conductive paste. FIG. 44 shows a cross section after the third portion was filled with an electrically-conductive paste, and the electrically-conductive paste was cured.

Example 1-7

Figure 45:
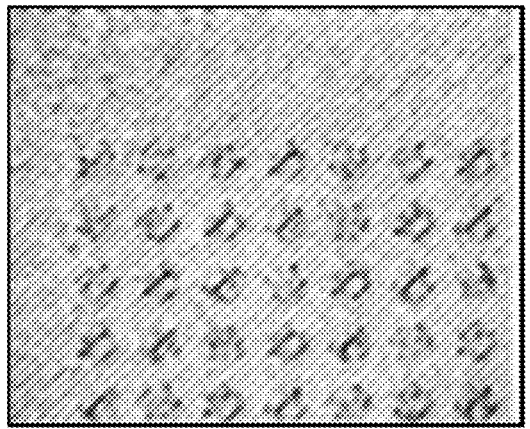
FIG. 45 shows a microscopic image of the fourth portion before being filled with an electrically-conductive paste.
Figure 46:
FIG. 46 shows a microscopic image of a cross section after the fourth portion was filled with an electrically-conductive paste and the electrically-conductive paste was cured.

The sample of Example 1-7 was produced likewise as the sample of Example 1-5 except that the fourth portion of the sample of Example 1-4 was filled with an electrically-conductive paste. FIG. 45 is a microscopic image showing the fourth portion before being filled with an electrically-conductive paste. FIG. 46 shows a cross section after the fourth portion was filled with an electrically-conductive paste and the electrically-conductive paste was cured.

With reference to the cross-sectional images of the samples of Example 1-5 to Example 1-7 (FIG. 42, FIG. 44 and FIG. 46), in each of the samples, it is found that part of the first wiring pattern was present inside the first grooves and the first recessed portions. Specifically, the first wiring pattern closely followed the shape of the bottom portion of the first groove structure, and no void was found between the first wiring pattern and the bottom portion of the first groove structure.

Evaluation 2: Shape of Bottom Portion of Groove Structure

A plurality of samples in which a plurality of second grooves each extend in the second direction in the bottom portion of the first groove structure were prepared by irradiating the bottom portion of the first groove structure with laser light by scanning with a laser light beam in the second direction that is different from the first direction instead of forming a plurality of first recessed portions having dot shapes in the first irradiation step. These samples were evaluated as to the shape of the bottom portion of the first groove structure.

Example 2-1

First, a first groove structure was formed in a resin plate, likewise as in production of the sample of Example 1-1 described above, so as to include five portions each having a first bottom surface defined by a set of a plurality of first grooves. However, in the present example, the laser light irradiation conditions were appropriately changed such that the pitch of the first grooves was 50 µm. Hereinafter, these five portions are referred to as "sixth portion", "seventh portion", "eighth portion", "ninth portion" and "tenth portion".

Subsequently, the bottom portion of the sixth portion of the first groove structure was irradiated with a laser light beam by scanning with the laser light beam in the second direction that intersects the first direction (corresponding to the previously-described first irradiation step). Thereby, likewise as in the example shown in FIG. 9, a plurality of second grooves each extending in the second direction were formed in the bottom portion of the sixth portion so as to overlap the first grooves. This was the sample of Example 2-1. In the present example, also, a direction selected as the second direction was perpendicular to the first direction. The irradiation conditions of the laser light in this step are as follows:

Peak wavelength of the laser light: 532 nm;
Laser power: 2.4 W;
Pulse width: 100 nanoseconds;
Frequency: 50 kHz;
Operation speed: 200 mm/s;
Defocus: 0 µm;
Pitch of the second grooves: 50 µm.

Figure 47:
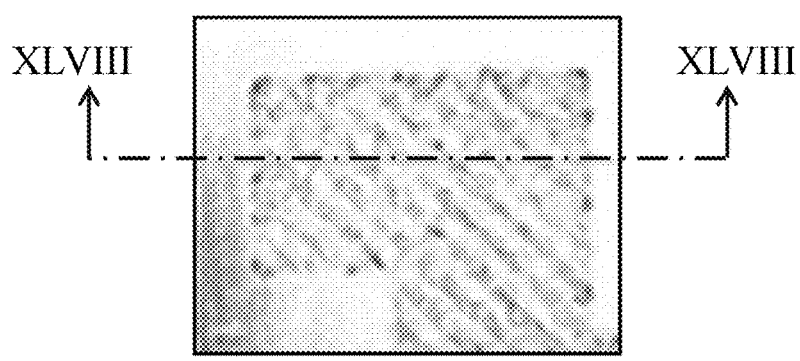
FIG. 47 shows a microscopic image of the first bottom surface of the sample of Example 2-1.
Figure 48:
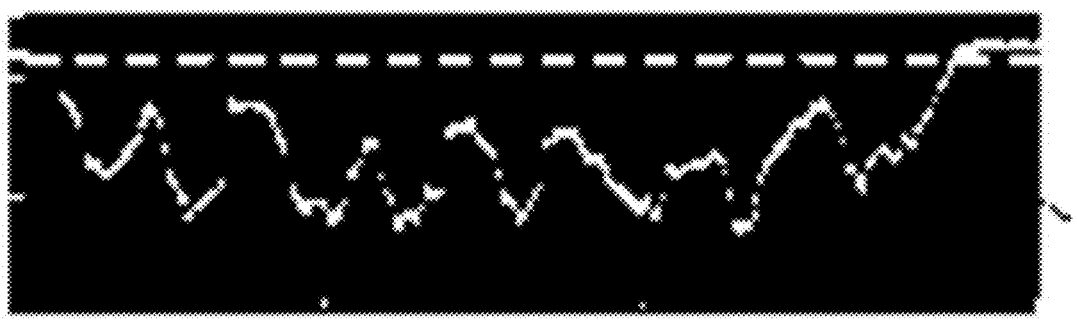
FIG. 48 shows a cross-sectional profile of the sample of Example 2-1.

FIG. 47 is an enlarged microscopic image showing the first bottom surface of the sample of Example 2-1. FIG. 48 shows a cross-sectional profile of the sample of Example 2-1 which was obtained by a laser microscope and which corresponds to a cross-sectional view taken along line XLVIII-XLVIII of FIG. 47. In FIG. 48, the horizontal dot-chain line represents the position of the surface of the resin plate before formation of the first groove structure. As shown in FIG. 48, in the present example, the bottom portion of the sixth portion is formed with eight first recessed portions aligned in the horizontal direction of the drawing page. In the cross-sectional profile shown in FIG. 48, the average depth of the eight first recessed portions was about 50 µm.

Example 2-2

The bottom portion of the seventh portion of the first groove structure was irradiated with a laser light beam under the same laser light irradiation conditions as those for Example 2-1 except that the laser power was 1.2 W. Thereby, a plurality of second grooves each extending in the second direction were formed in the bottom portion of the seventh portion so as to overlap the first grooves. This was the sample of Example 2-2.

Figure 49:
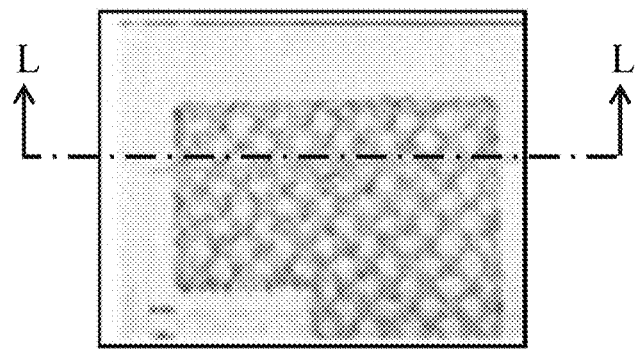
FIG. 49 shows a microscopic image of the first bottom surface of the sample of Example 2-2.
Figure 50:
FIG. 50 shows a cross-sectional profile of the sample of Example 2-2.

FIG. 49 is an enlarged microscopic image showing the first bottom surface of the sample of Example 2-2. FIG. 50 shows a cross-sectional profile of the sample of Example 2-2 which was obtained by a laser microscope and which corresponds to a cross-sectional view taken along line L-L of FIG. 49. In FIG. 50, likewise as in FIG. 48, the horizontal dot-chain line represents the position of the surface of the resin plate before formation of the first groove structure. Also, in this example, likewise as in the example shown in FIG. 48, the bottom portion has eight first recessed portions aligned along line L-L. In the cross-sectional profile shown in FIG. 50, the average depth of the eight first recessed portions was about 35 μm.

Example 2-3

The bottom portion of the eighth portion of the first groove structure was irradiated with a laser light beam under the same laser light irradiation conditions as those for Example 2-1 except that the laser power was 1.6 W. Thereby, a plurality of second grooves each extending in the second direction were formed in the bottom portion of the eighth portion so as to overlap the first grooves. This was the sample of Example 2-3.

Figure 51:
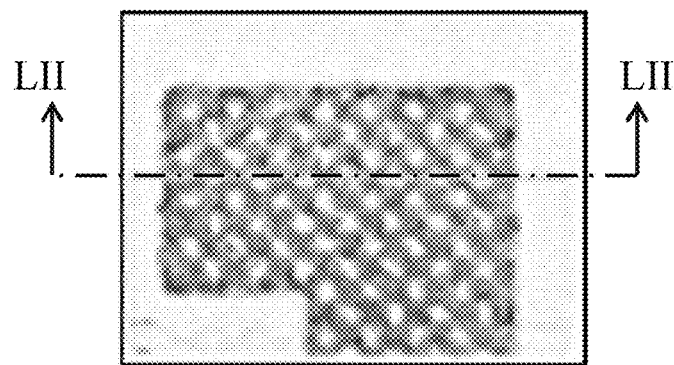
FIG. 51 shows a microscopic image of the first bottom surface of the sample of Example 2-3.
Figure 52:
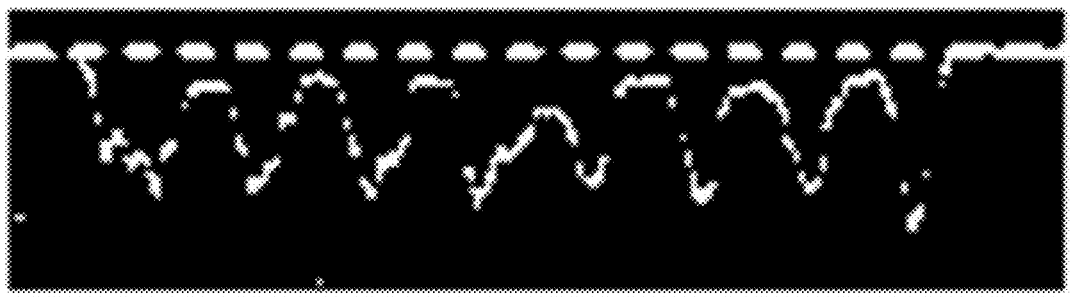
FIG. 52 shows a cross-sectional profile of the sample of Example 2-3.

FIG. 51 is an enlarged microscopic image showing the first bottom surface of the sample of Example 2-3. FIG. 52 shows a cross-sectional profile of the sample of Example 2-3 which was obtained by a laser microscope and which corresponds to a cross-sectional view taken along line LII-LII of FIG. 51. In FIG. 52, the horizontal dot-chain line represents the position of the surface of the resin plate before formation of the first groove structure. Also, in this example, likewise as in the examples shown in FIG. 48 and FIG. 50, the bottom portion has eight first recessed portions aligned along line LII-LII. In the cross-sectional profile shown in FIG. 52, the average depth of the eight first recessed portions was about 37 μm.

Example 2-4

The bottom portion of the ninth portion of the first groove structure was irradiated with a laser light beam under the same laser light irradiation conditions as those for Example 2-1 except that the laser power was 2 W. Thereby, a plurality of second grooves each extending in the second direction were formed in the bottom portion of the ninth portion so as to overlap the first grooves. This was the sample of Example 2-4.

Figure 53:
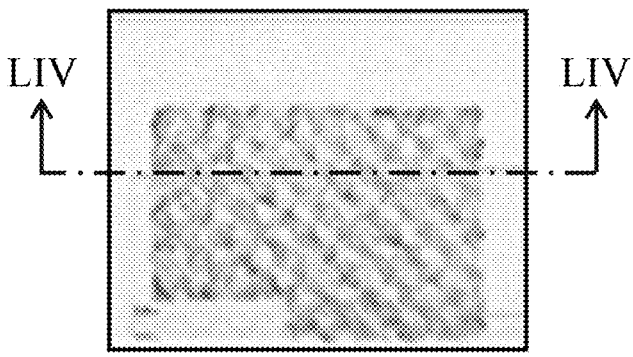
FIG. 53 shows a microscopic image of the first bottom surface of the sample of Example 2-4.
Figure 54:
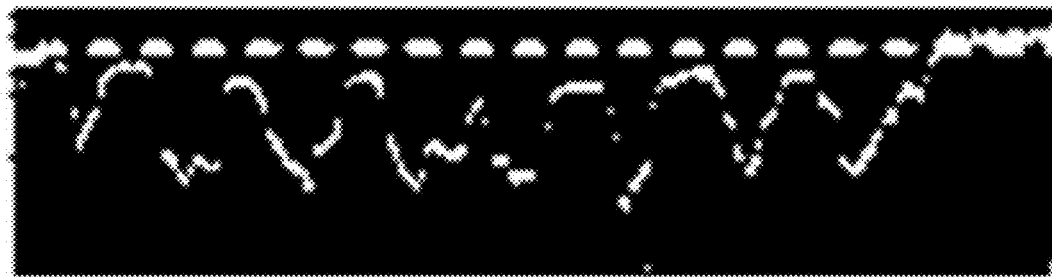
FIG. 54 shows a cross-sectional profile of the sample of Example 2-4.

FIG. 53 is an enlarged microscopic image showing the first bottom surface of the sample of Example 2-4. FIG. 54 shows a cross-sectional profile of the sample of Example 2-4 which was obtained by a laser microscope and which corresponds to a cross-sectional view taken along line LIV-LIV of FIG. 53. In FIG. 54, the horizontal dot-chain line represents the position of the surface of the resin plate before formation of the first groove structure. Also, in this example, likewise as in the examples shown in FIG. 48, FIG. 50 and FIG. 52, the bottom portion has eight first recessed portions aligned along line LIV-LIV. In the cross-sectional profile shown in FIG. 54, the average depth of the eight first recessed portions was about 42 μm.

Reference Example 2-1

The bottom portion of the tenth portion of the first groove structure was irradiated with a laser light beam under the same laser light irradiation conditions as those for Example 2-1 except that the operation speed was 500 mm/s. Thereby, a plurality of second grooves each extending in the second direction were formed in the bottom portion of the tenth portion so as to overlap the first grooves. This was the sample of Reference Example 2-1.

Figure 55:
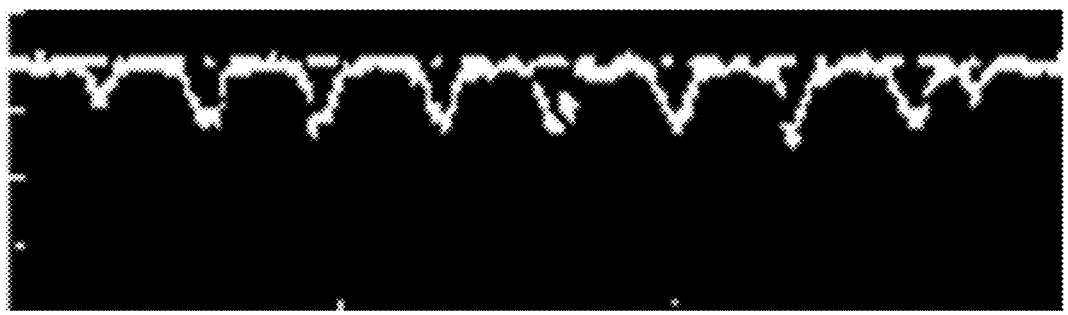
FIG. 55 shows a cross-sectional profile of the sample of Reference Example 2-1.

FIG. 55 shows a cross-sectional profile of the sample of Reference Example 2-1 which was obtained by a laser microscope. In FIG. 55, the horizontal dot-chain line represents the position of the surface of the resin plate before formation of the first groove structure. Also, in this example, likewise as in the examples shown in FIG. 48, FIG. 50, FIG. 52 and FIG. 54, it was confirmed in a cross-sectional view that eight first recessed portions were formed. In the cross-sectional profile shown in FIG. 55, the average depth of the eight first recessed portions was about 30 μm.

With reference to the cross-sectional profiles of the samples of Example 2-1 to Example 2-4 (FIG. 48, FIG. 50, FIG. 52 and FIG. 54), it was found that a plurality of apexes formed between two adjacent first grooves were at a position lower than the surface of the resin plate before formation of the first groove structure also in these samples likewise as in the samples of Example 1-1 to Example 1-4 and Reference Example 1-1. Therefore, also in these samples, achievement of the anchoring effect at the interfaces between the lateral surfaces of the first groove structure and the first electrically-conductive material can be expected.

In comparison, as seen from the cross-sectional profile of the sample of Reference Example 2-1 (FIG. 55), the position of the first bottom surface in the sample of Reference Example 2-1 is substantially identical with the position of the surface of the resin plate before formation of the first groove structure. This means that forming a first wiring pattern of a large aspect ratio is relatively difficult. In consideration of this, it can be said that the operation speed is preferably not excessively high from the viewpoint of placing the first electrically-conductive material inside the first groove structure to form the first wiring pattern of the first electrically-conductive material.

Evaluation 2: Shape of First Wiring Pattern

Subsequently, also as for the configuration in which a plurality of first grooves and a plurality of second grooves were provided in the bottom portion of the first groove structure, it was checked whether the first wiring pattern had a shape following the shape of the bottom portion of the first groove structure.

Example 2-5

Likewise as in the sample of Example 1-5, the sixth portion of the first groove structure was filled with an electrically-conductive paste, and the electrically-conductive paste was cured. Thereby, the sample of Example 2-5 was obtained in which the first wiring pattern formed of the electrically-conductive paste was inside the sixth portion.

Figure 56:
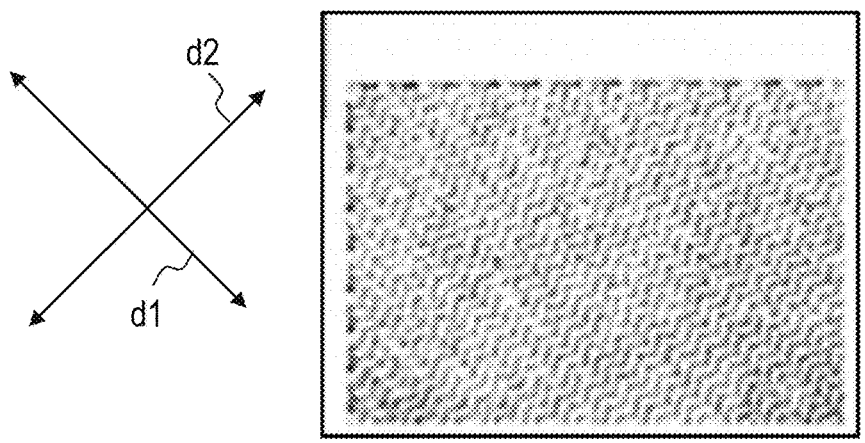
FIG. 56 shows a microscopic image of the sixth portion before being filled with an electrically-conductive paste.
Figure 57:
FIG. 57 shows a microscopic image of a cross section after the sixth portion was filled with an electrically-conductive paste and the electrically-conductive paste was cured.

FIG. 56 is a microscopic image showing the sixth portion before being filled with an electrically-conductive paste. In FIG. 56, a plurality of grooves of a zig-zag shape appear to be provided in the bottom portion of the first groove structure although in actuality formation of a plurality of first grooves by scanning with a laser light beam along the first direction and formation of a plurality of second grooves by scanning with a laser light beam along the second direction were sequentially performed. In FIG. 56, a double-headed arrow d1 and a double-headed arrow d2 represent the first direction and the second direction, respectively. FIG. 57 shows a cross section after the sixth portion was filled with an electrically-conductive paste and the electrically-conductive paste was cured. In FIG. 57, a white broken line represents an approximate position of the first bottom surface of the first groove structure.

Example 2-6

Figure 58:
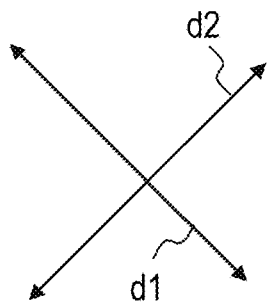
FIG. 58 shows a microscopic image of the eighth portion before being filled with an electrically-conductive paste.
Figure 58:
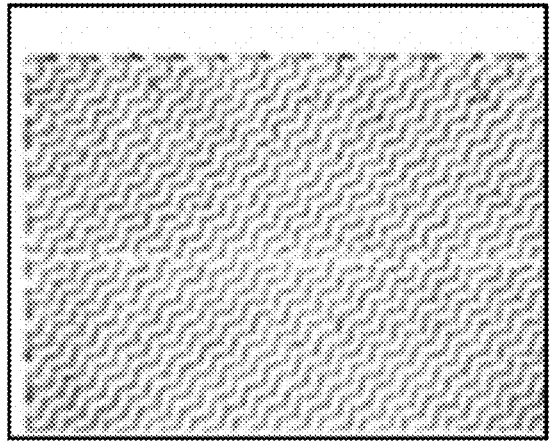
Figure 59:
FIG. 59 shows a microscopic image of a cross section after the eighth portion was filled with an electrically-conductive paste and the electrically-conductive paste was cured.

The sample of Example 2-6 was produced in the same way as the sample of Example 2-5 except that the eighth portion of the sample of Example 2-3 was filled with an electrically-conductive paste. FIG. 58 is a microscopic image showing the eighth portion before being filled with an electrically-conductive paste. The sample of Example 2-6 was equal to the sample of Example 2-5 in that formation of a plurality of first grooves by scanning with a laser light beam along the first direction and formation of a plurality of second grooves by scanning with a laser light beam along the second direction were sequentially performed. FIG. 59 shows a cross section after the eighth portion was filled with an electrically-conductive paste and the electrically-conductive paste was cured. In FIG. 59, likewise as in FIG. 57, a white broken line represents an approximate position of the first bottom surface of the first groove structure.

Example 2-7

Figure 60:
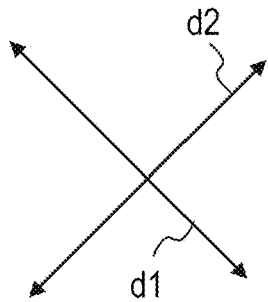
FIG. 60 shows a microscopic image of the ninth portion before being filled with an electrically-conductive paste.
Figure 60:
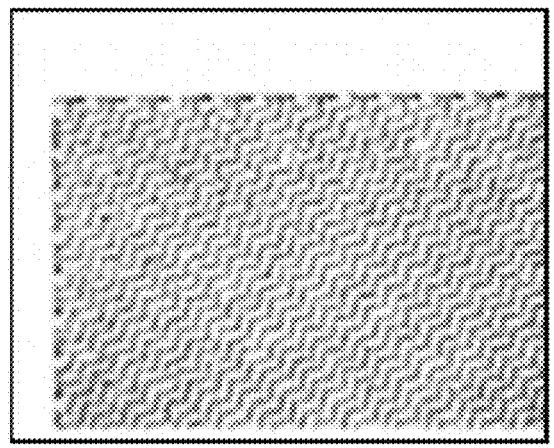
Figure 61:
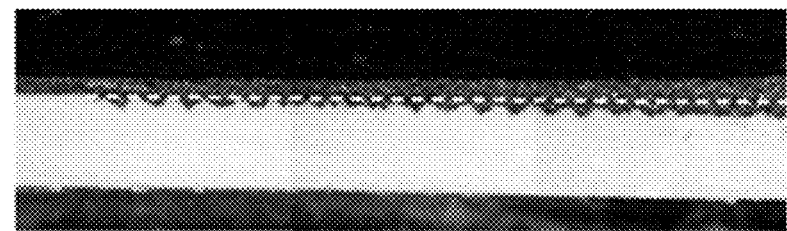
FIG. 61 shows a microscopic image of a cross section after the ninth portion was filled with an electrically-conductive paste and the electrically-conductive paste was cured.

The sample of Example 2-7 was produced in the same way as the sample of Example 2-5 except that the ninth portion of the sample of Example 2-4 was filled with an electrically-conductive paste. FIG. 60 is a microscopic image showing the ninth portion before being filled with an electrically-conductive paste. Also, in this example, likewise as the sample of Example 2-5 and the sample of Example 2-6, formation of a plurality of first grooves by scanning with a laser light beam along the first direction and formation of a plurality of second grooves by scanning with a laser light beam along the second direction were sequentially performed. FIG. 61 shows a cross section after the ninth portion was filled with an electrically-conductive paste, and the electrically-conductive paste was cured. In FIG. 61, a white broken line represents an approximate position of the first bottom surface of the first groove structure.

The cross-sectional images of the samples of Example 2-5 to Example 2-7 (FIG. 57, FIG. 59 and FIG. 61), in each of the samples, it was found that part of the first wiring pattern was present inside the first grooves and the second grooves. Specifically, the first wiring pattern closely followed the shape of the bottom portion of the first groove structure, and no void was found between the first wiring pattern and the bottom portion of the first groove structure.
Evaluation: Adhesion of First Wiring Pattern Subsequently, simple evaluation of the adhesion of the first wiring pattern was carried out by a method compliant with a crosscut test specified by JIS K 5600-5-6 (1999) likewise as evaluation of the mechanical properties of a paint coating.

Example 3-1

A first groove structure including seven rectangular portions having a first bottom surface defined by a set of a plurality of first grooves was formed in a resin plate. The irradiation conditions of the laser light in this step are as follows:
    Peak wavelength of the laser light: 532 nm;
    Laser power: 0.3 W to 2.8 W;
    Pulse width: 100 nanoseconds;
    Frequency: 50 kHz;
    Operation speed: 200 mm/s;
    Defocus: 0 µm;
    Pitch of the first grooves: 15 µm.

Hereinafter, the seven portions formed in this step are referred to as "eleventh portion", "twelfth portion", "thirteenth portion", "fourteenth portion", "fifteenth portion", "sixteenth portion" and "seventeenth portion". In the present example, the laser power was adjusted such that the depth of the first grooves was different among the eleventh to seventeenth portions. The laser power in formation of the eleventh portion was 0.3 W. The dimension of the eleventh to seventeenth portions as viewed from the top was in the range of about 300 µm square to about 500 µm square.

Subsequently, by scanning with a laser light beam in the second direction that intersect the first direction, the bottom portion of the eleventh portion of the first groove structure was irradiated with the laser light beam. Thereby, likewise as in the example shown in FIG. 9, a plurality of second grooves each extending in the second direction were formed in the bottom portion of the eleventh portion so as to overlap the first grooves. In the present example, also, a direction selected as the second direction was perpendicular to the first direction. The irradiation conditions of the laser light in this step are as follows:
    Peak wavelength of the laser light: 532 nm;
    Laser power: 0.3 W;
    Pulse width: 100 nanoseconds;
    Frequency: 50 kHz;
    Operation speed: 200 mm/s;
    Defocus: 0 µm;
    Pitch of the second grooves: 20 µm.

The depth of the second grooves was measured by a cross-sectional image taken with a laser microscope. The average depth of the second grooves was about 5 µm.

Subsequently, likewise as in the sample of Example 1-5, the eleventh portion of the first groove structure was filled with an electrically-conductive paste, and the electrically-conductive paste was cured. Thereby, the sample of Example 3-1 was obtained in which the first wiring pattern formed of the electrically-conductive paste was inside the eleventh portion.

Example 3-2

A plurality of second grooves each extending in the second direction were formed in the bottom portion of the twelfth portion so as to overlap the first grooves in the same way as the sample of Example 3-1 except that the laser power, which is one of the laser light irradiation conditions, was changed to 0.6 W so as to increase the depths of the first grooves and the depth of the second grooves. The depth of the second grooves was measured by a cross-sectional image taken with a laser microscope. The average depth of the second grooves was about 10 µm.

Subsequently, likewise as in the sample of Example 3-1, the twelfth portion of the first groove structure was filled with an electrically-conductive paste, and the electrically-conductive paste was cured. Thereby, the sample of Example 3-2 was obtained in which the first wiring pattern formed of the electrically-conductive paste was inside the twelfth portion.

Example 3-3

A plurality of second grooves each extending in the second direction were formed in the bottom portion of the thirteenth portion so as to overlap the first grooves in the same way as the sample of Example 3-1 except that the laser power, which is one of the laser light irradiation conditions, was changed to 1.2 W so as to increase the depths of the first grooves and the depth of the second grooves. The depth of the second grooves was measured by a cross-sectional image taken with a laser microscope. The average depth of the second grooves was about 25 μm.

Subsequently, likewise as in the sample of Example 3-1, the thirteenth portion of the first groove structure was filled with an electrically-conductive paste, and the electrically-conductive paste was cured. Thereby, the sample of Example 3-3 was obtained in which the first wiring pattern formed of the electrically-conductive paste was inside the thirteenth portion.

Example 3-4

A plurality of second grooves each extending in the second direction were formed in the bottom portion of the fourteenth portion so as to overlap the first grooves in the same way as the sample of Example 3-1 except that the laser power, which is one of the laser light irradiation conditions, was changed to 2.4 W so as to increase the depths of the first grooves and the depth of the second grooves. The depth of the second grooves was measured by a cross-sectional image taken with a laser microscope. The average depth of the second grooves was about 50 μm.

Subsequently, likewise as in the sample of Example 3-1, the fourteenth portion of the first groove structure was filled with an electrically-conductive paste, and the electrically-conductive paste was cured. Thereby, the sample of Example 3-4 was obtained in which the first wiring pattern formed of the electrically-conductive paste was inside the fourteenth portion.

Comparative Example 3-1

The fifteenth portion with a plurality of first grooves each extending in the first direction was formed in the same way as the sample of Example 3-1 except that the laser light irradiation conditions were changed in formation of the first grooves so as to decrease the depth of the first grooves. In the present example, the laser power for forming the plurality of first grooves was changed to 0.2 W. Also, in the present example, no second grooves were formed. The depth of the first grooves was measured by a cross-sectional image taken with a laser microscope. The average depth of the first grooves was about 1.5 μm.

Subsequently, likewise as in the sample of Example 3-1, the fifteenth portion of the first groove structure was filled with an electrically-conductive paste, and the electrically-conductive paste was cured. Thereby, the sample of Comparative Example 3-1 was obtained in which the first wiring pattern formed of the electrically-conductive paste was inside the fifteenth portion.

Comparative Example 3-2

The sixteenth portion with a plurality of first grooves each extending in the first direction was formed in the same way as the sample of Comparative Example 3-1 except that the laser light irradiation conditions were changed such that the depth of the first grooves is smaller than that in the sample of Example 3-1. In the present example, the laser power for forming the plurality of first grooves was changed to 0.2 W.

Subsequently, by scanning with a laser light beam in the second direction that intersects the first direction, the bottom portion of the sixteenth portion of the first groove structure was irradiated with the laser light beam. Thereby, likewise as in the example shown in FIG. 9, a plurality of second grooves each extending in the second direction were formed in the bottom portion of the sixteenth portion so as to overlap the first grooves. Also, in the present example, a direction selected as the second direction was perpendicular to the first direction. The irradiation conditions of the laser light in this step are the same as those for formation of the first grooves except that the laser power was 0.2 W, and the pitch of the second grooves was 20 μm. The depth of the second grooves was measured by a cross-sectional image with a laser microscope. The average depth of the second grooves was about 3 μm.

Subsequently, likewise as in the sample of Example 3-1, the sixteenth portion of the first groove structure was filled with an electrically-conductive paste, and the electrically-conductive paste was cured. Thereby, the sample of Comparative Example 3-2 was obtained in which the first wiring pattern formed of the electrically-conductive paste was inside the sixteenth portion.

Comparative Example 3-3

The seventeenth portion with a plurality of first grooves each extending in the first direction was formed in the same way as the sample of Example 3-1 except that the laser light irradiation conditions in formation of the first grooves were changed so as to increase the depth of the first grooves. In the present example, the laser power for forming the plurality of first grooves was changed to 2.8 W.

Subsequently, by scanning with a laser light beam in the second direction that intersects the first direction, the bottom portion of the seventeenth portion of the first groove structure was irradiated with the laser light beam under the same laser light irradiation conditions as those for the sample of Comparative Example 3-2 except that the laser power was 2.8 W, whereby a plurality of second grooves were formed in the bottom portion of the seventeenth portion so as to overlap the first grooves. The depth of the second grooves was measured by a cross-sectional image taken with a laser microscope. The average depth of the second grooves was about 60 μm.

Subsequently, in the same way as the sample of Example 3-1, we attempted to fill the seventeenth portion of the first groove structure with an electrically-conductive paste. However, the inside of the seventeenth portion was not sufficiently filled with the electrically-conductive paste. After the electrically-conductive paste was cured, an obtained wiring pattern did not have a desired shape.

Subsequently, in each of the samples of Example 3-1 to Example 3-4, Comparative Example 3-1 and Comparative Example 3-2, grooves are formed in the form of a grid in the first wiring pattern using a cutter so as to reach the first bottom surface, whereby 25 rectangular sections in total were formed. In this step, the grooves were formed in the first wiring pattern at a pitch of about 1 mm.

Subsequently, a cellophane tape was placed onto the surface of the first wiring pattern so as to cover the plurality of sections formed in the first wiring pattern. Before five minutes elapsed since the tape was placed, the tape was peeled off in the normal direction of the surface of the first wiring pattern. Of the 25 sections formed in the first wiring pattern, the proportion of sections in which the first wiring pattern was adhered to the tape and separated from the resin plate was checked, whereby the adhesion of the first wiring pattern was evaluated.

In the sample of Example 3-1, separation was found in only one of the 25 sections. In each of the samples of Example 3-2 to Example 3-4, separation was not found in any of the 25 sections. Meanwhile, in the sample of Comparative Example 3-1 and the sample of Comparative Example 3-2, separation was found in 12.5 sections and 5 sections, respectively, out of the 25 sections.

Figure 62:
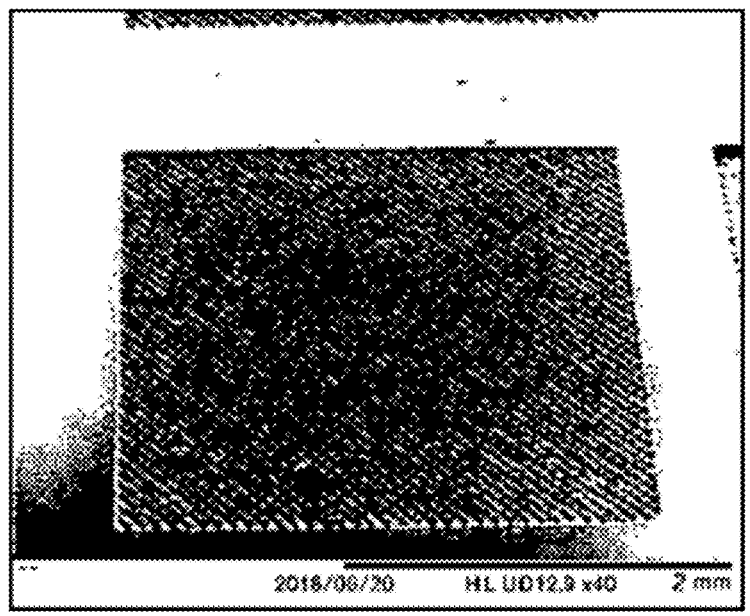
FIG. 62 shows a microscopic image of the first bottom surface of the sample of Example 3-3 before being filled with an electrically-conductive paste.
Figure 63:
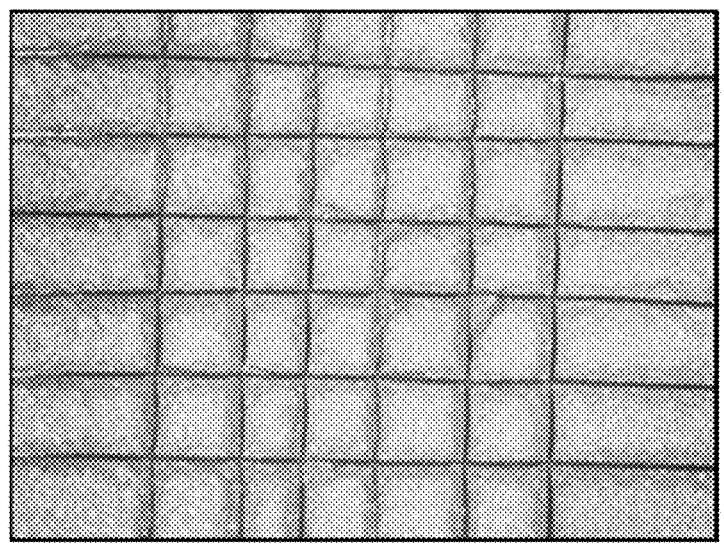
FIG. 63 is a plan view showing the external appearance of the first wiring pattern after the tape was peeled off in the sample of Example 3-3.
Figure 64:
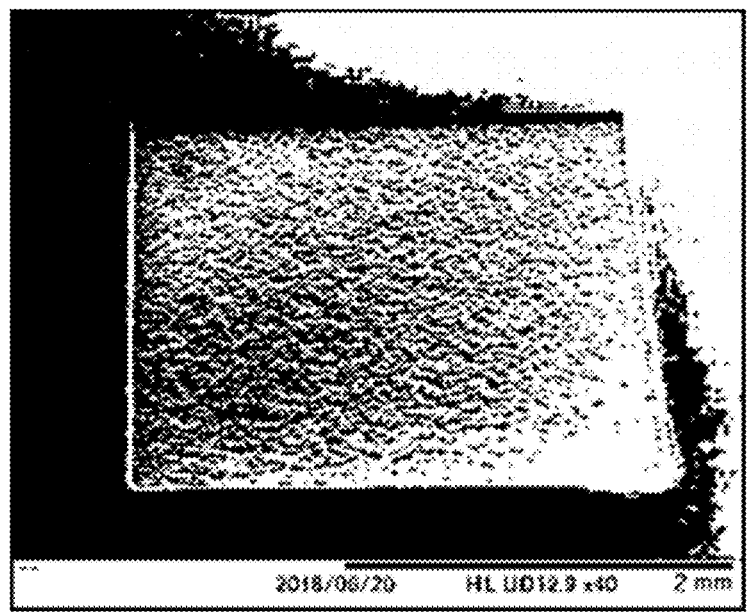
FIG. 64 shows a microscopic image of the first bottom surface of the sample of Comparative Example 3-1 before being filled with an electrically-conductive paste.
Figure 65:
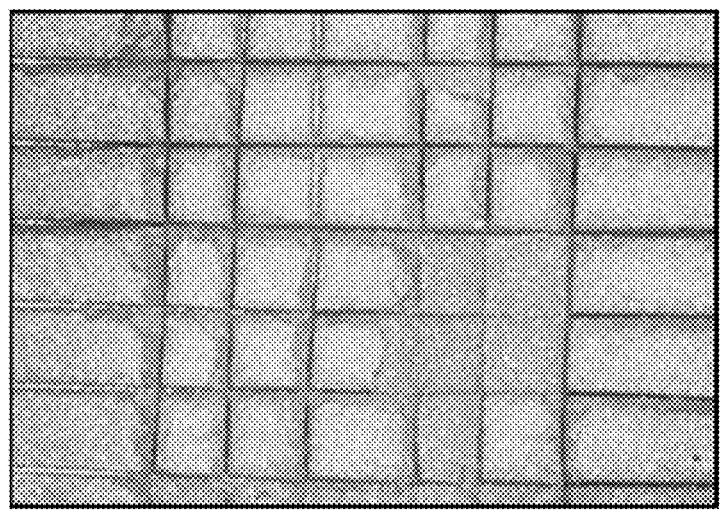
FIG. 65 is a plan view showing the external appearance of the first wiring pattern after the tape was peeled off in the sample of Comparative Example 3-2.

FIG. 62 is an enlarged microscopic image showing the first bottom surface of the sample of Example 3-3 before being filled with an electrically-conductive paste. FIG. 63 shows the external appearance of the first wiring pattern after the tape was peeled off in the sample of Example 3-3. FIG. 64 is an enlarged microscopic image showing the first bottom surface of the sample of Comparative Example 3-1 before being filled with an electrically-conductive paste. FIG. 65 shows the external appearance of the first wiring pattern after the tape was peeled off in the sample of Comparative Example 3-2.

As seen from the results after the tape was peeled off, formation of the second grooves can provide the effect of preventing separation of the first wiring pattern due to the anchoring effect. Particularly, when the depth of the second grooves is not less than 5 μm, it is advantageous in preventing separation of the first wiring pattern. It was also found that although a greater anchoring effect tends to be achieved as the second grooves are deeper, keeping the depth of the second grooves so as not to exceed 60 μm is advantageous in forming the first wiring pattern with a desired shape.

A wiring board of an embodiment of the present disclosure is useful in situations where a printed wiring board is used. According to an embodiment of the present disclosure, formation of low-resistance wires is relatively easy, and forming wiring patterns on both opposing sides of a substrates is also easily performed with relatively arbitrarily shapes. Thus, particularly, an embodiment of the present disclosure is advantageous in high-density mounting of electronic components. An embodiment of the present disclosure is also applicable to production of an interposer which is provided between electronic components and a wiring board.

While certain embodiments of the present invention has been described above, it will be apparent to those skilled in the art that the invention can be modified in numerous ways and can assume many embodiments other than those specifically described above. Accordingly, it is intended by the appended claims to cover all modifications of the invention that fall within the spirit and scope of the invention.

What is claimed is:

1. A wiring board comprising:
   a base having a first principal surface that has a first groove structure, the first groove structure having a first width; and
   a first wiring pattern provided inside the first groove structure,
   wherein the first groove structure has a first bottom surface that is formed by a set of a plurality of first grooves, each of the plurality of first grooves having a second width that is smaller than the first width,
   wherein the first bottom surface further has a plurality of second grooves, each of the plurality of second grooves having a third width which is smaller than the first width, and each of the plurality of second grooves extending in a direction different from an extending direction of the plurality of first grooves, and
   an upper surface of the first wiring pattern is substantially planar.

2. The wiring board of claim 1, wherein a surface of the first wiring pattern is substantially coplanar with the first principal surface of the base.

3. The wiring board of claim 1, wherein
   the base has a second principal surface that is opposite to the first principal surface, the second principal surface having a second groove structure that has a fourth width,
   the wiring board further includes a second wiring pattern provided in the second groove structure,
   the second groove structure has a second bottom surface that is formed by a set of a plurality of third grooves, each of the plurality of third grooves having a fifth width that is smaller than the fourth width, and
   the second bottom surface further has a plurality of second recessed portions having dot shapes.

4. The wiring board of claim 3, wherein a diameter of each of the plurality of second recessed portions is greater than the fifth width.

5. The wiring board of claim 3, wherein a pitch of the plurality of third grooves is in a range of 10% to 100% of a distance between centers of the second recessed portions.

6. The wiring board of claim 3, wherein the base includes a via inside the base, the via coupling the first wiring pattern at the first principal surface side with the second wiring pattern at the second principal surface side.

7. The wiring board of claim 1, wherein
   the base has a second principal surface that is opposite to the first principal surface, the second principal surface having a second groove structure that has a fourth width,
   the wiring board further includes a second wiring pattern provided in the second groove structure,
   the second groove structure has a second bottom surface that is formed by a set of a plurality of third grooves, each of the plurality of third grooves having a fifth width that is smaller than the fourth width, and
   the second bottom surface further has a plurality of fourth grooves, each of the plurality of fourth grooves having a sixth width that is smaller than the fourth width, and each of the plurality of fourth grooves extending in a direction different from an extending direction of the plurality of third grooves.

8. A wiring board manufacturing method comprising:
   forming a first groove structure in a first principal surface of a base by scanning with laser light in a first irradiation pattern such that the first groove structure has a first width, the forming of the first groove structure includes forming a plurality of first grooves;
   irradiating an inside of the first groove structure with laser light in a second irradiation pattern that is different from the first irradiation pattern to form recessed portions inside the first groove structure, the irradiating of the inside of the first groove structure includes forming a plurality of first recessed portions having dot shapes inside the first groove structure; and
   forming a first wiring pattern by filling the first groove structure with a first electrically-conductive material to form a first wiring pattern whose shape matches with a shape of the first groove structure in a top view, the forming of the first wiring pattern includes filling the first electrically-conductive material in the plurality of first recessed portions.

9. The wiring board manufacturing method of claim 8, wherein
the plurality of first grooves each have a second width that is smaller than the first width, and
each of the plurality of first recessed portions has a diameter greater than the second width.

10. The wiring board manufacturing method of claim 8, wherein
the plurality of first grooves each have a second width that is smaller than the first width, and
a pitch of the plurality of first grooves is in a range of 10% to 100% of a distance between centers of the first recessed portions.

11. The wiring board manufacturing method of claim 8, wherein
the plurality of first grooves each have a second width that is smaller than the first width, and
the irradiating of the inside of the first groove structure includes forming a plurality of second grooves inside the first groove structure, each of the plurality of second grooves having a third width that is smaller than the first width.

12. The wiring board manufacturing method of claim 11, wherein
the forming of the first grooves includes forming the first grooves each extending in a first direction by scanning with laser light in the first direction, and
the forming of the second grooves includes forming the second grooves by scanning with laser light in a second direction that is different from the first direction, each of the plurality of second grooves extending in the second direction.

13. The wiring board manufacturing method of claim 8, wherein the forming of the first wiring pattern includes:
placing an electrically-conductive paste as the first electrically-conductive material inside the first groove structure by printing; and
curing the electrically-conductive paste.

14. The wiring board manufacturing method of claim 13, wherein forming of the first wiring pattern further includes:
after the curing, grinding a surface of the cured electrically-conductive paste such that the ground surface becomes coplanar with the first principal surface of the base.

15. The wiring board manufacturing method of claim 8, wherein
the base has a second principal surface that is opposite to the first principal surface, and
the method further includes:
forming a second groove structure in the second principal surface of the base by scanning with laser light in a third irradiation pattern, the second groove structure having a fourth width;
irradiating an inside of the second groove structure with laser light in a fourth irradiation pattern that is different from the third irradiation pattern to form recessed portions inside the second groove structure; and
forming a second wiring pattern by filling the second groove structure with a second electrically-conductive material to form a second wiring pattern whose shape matches with a shape of the second groove structure in a top view.

16. The wiring board manufacturing method of claim 15, wherein
the irradiating of the inside of the second groove structure includes forming a plurality of second recessed portions having dot shapes inside the second groove structure, and
the forming of the second wiring pattern includes filling the second electrically-conductive material in the plurality of second recessed portions.

17. The wiring board manufacturing method of claim 15, wherein
the forming of the second groove structure includes forming a plurality of third grooves each having a fifth width that is smaller than the fourth width, and
the irradiating of the inside of the second groove structure includes forming a plurality of fourth grooves in the second groove structure, each of the plurality of fourth grooves having a sixth width that is smaller than the fourth width.

18. The wiring board manufacturing method of claim 15, further comprising, between the forming of the second groove structure and the irradiating of the second groove structure, forming a through hole by irradiation with laser light, the through hole extending between the second groove structure at the second principal surface side and the first groove structure at the first principal surface side, and
wherein the forming of the second wiring pattern includes:
placing an electrically-conductive paste as the second electrically-conductive material inside the through hole; and
forming a via that couples the first wiring pattern at the first principal surface side with the second wiring pattern at the second principal surface side, by curing the electrically-conductive paste placed inside the through hole.

19. The wiring board manufacturing method of claim 8, wherein the base is a resin or ceramic substrate which contains a material capable of absorbing the laser light.

* * * * *